(12) United States Patent
Arita

(10) Patent No.: US 10,907,864 B2
(45) Date of Patent: Feb. 2, 2021

(54) COOLING SYSTEM

(71) Applicant: Tokyo Electron Limited, Tokyo (JP)

(72) Inventor: Takehiko Arita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 127 days.

(21) Appl. No.: 16/367,428

(22) Filed: Mar. 28, 2019

(65) Prior Publication Data
US 2019/0301812 A1 Oct. 3, 2019

(30) Foreign Application Priority Data

Mar. 29, 2018 (JP) .................................. 2018-064779

(51) Int. Cl.
| | |
|---|---|
| *F25B 7/00* | (2006.01) |
| *F25B 9/00* | (2006.01) |
| *F25B 49/02* | (2006.01) |
| *H01L 21/683* | (2006.01) |
| *F25B 41/04* | (2006.01) |

(Continued)

(52) U.S. Cl.
CPC ................ *F25B 7/00* (2013.01); *F25B 9/006* (2013.01); *F25B 49/02* (2013.01); *H01L 21/683* (2013.01); *F25B 2400/077* (2013.01); *F25B 2400/23* (2013.01)

(58) Field of Classification Search
CPC ........ F25B 7/00; F25B 9/006; F25B 2400/23; F28D 15/02
See application file for complete search history.

(56) References Cited

U.S. PATENT DOCUMENTS

| | | | | |
|---|---|---|---|---|
| 3,768,273 | A | * 10/1973 | Missimer | ................ F25B 9/006 62/84 |
| 4,597,267 | A | * 7/1986 | Forrest | ..................... B01D 8/00 62/55.5 |

(Continued)

FOREIGN PATENT DOCUMENTS

JP 2000-124299 A 4/2000

*Primary Examiner* — Christopher R Zerphey
(74) *Attorney, Agent, or Firm* — Pearne & Gordon LLP

(57) ABSTRACT

A cooling system includes a heat exchange unit; a supply line configured to send a coolant to the heat exchange unit; a drain line configured to send the coolant drained from the heat exchange unit; a first to a $n^{th}$ gas-liquid separating units connected in series to a gas line in which a gas of the coolant flows; a first to a $n^{th}$ cooling lines extended via the first to the $n^{th}$ gas-liquid separating units, respectively. Both ends of the first cooling line are connected to a cooling device. The second to the $n^{th}$ cooling lines are provided between the drain line and a first to a $(n-1)^{th}$ liquid lines via the second to the $n^{th}$ gas-liquid separating units, respectively. The first to the $n^{th}$ gas-liquid separating units are respectively connected to liquid lines, and the liquid lines communicate with the supply line connected to the heat exchange unit.

5 Claims, 18 Drawing Sheets

(51) Int. Cl.
F25B 6/04 (2006.01)
H01L 21/67 (2006.01)

(56) References Cited

U.S. PATENT DOCUMENTS

| | | | | |
|---|---|---|---|---|
| 4,763,486 A * | 8/1988 | Forrest | ............... | F25B 9/006 |
| | | | | 62/175 |
| 4,788,829 A * | 12/1988 | Takemasa | ............ | F25B 5/00 |
| | | | | 62/113 |
| 5,265,443 A * | 11/1993 | Yuzawa | ............ | C09K 5/044 |
| | | | | 252/67 |
| 6,481,223 B2 * | 11/2002 | Flynn | ............... | C09K 5/045 |
| | | | | 62/114 |
| 7,603,871 B2 * | 10/2009 | Kufis | ............... | F25B 9/006 |
| | | | | 62/175 |
| 7,624,585 B2 * | 12/2009 | Yuzawa | ............ | C09K 5/045 |
| | | | | 62/114 |
| 8,826,686 B2 * | 9/2014 | Takasugi | ............ | F25D 19/02 |
| | | | | 62/335 |
| 9,335,070 B2 * | 5/2016 | Kobayashi | ......... | F25D 23/061 |
| 10,704,808 B2 * | 7/2020 | Takahashi | ......... | F25D 19/04 |
| 2009/0126389 A1 * | 5/2009 | Takasugi | ............ | F25B 45/00 |
| | | | | 62/335 |
| 2009/0249823 A1 * | 10/2009 | Okuda | ............... | F25D 19/02 |
| | | | | 62/440 |
| 2010/0147017 A1 * | 6/2010 | Takasugi | ............ | F25B 9/006 |
| | | | | 62/470 |
| 2011/0126575 A1 * | 6/2011 | Kobayashi | ......... | F25B 9/006 |
| | | | | 62/333 |
| 2019/0304761 A1 * | 10/2019 | Mitsumori | ......... | H01L 21/67248 |

* cited by examiner

| | FCV-1 | ... | FCV-n | TOTAL |
|---|---|---|---|---|
| T1 | 30% | ... | 10% | 100% |
| T2 | 20% | ... | 5% | 100% |
| ... | ... | ... | ... | 100% |

PT2 →

| | FCV-1 | ... | FCV-n | TOTAL |
|---|---|---|---|---|
| T1 | 50% | ... | 20% | 100% |
| ... | 50% | ... | 20% | 100% |

PT3 →

| | FCV-1 | ... | FCV-n | TOTAL |
|---|---|---|---|---|
| T1 | 100% | ... | 0% | 100% |
| T2 | 0% | ... | 100% | 100% |
| ... | ... | ... | ... | 100% |

COOLING SYSTEM

CROSS-REFERENCE TO RELATED APPLICATION

This application claims the benefit of Japanese Patent Application No. 2018-064779 filed on Mar. 29, 2018, the entire disclosures of which are incorporated herein by reference.

TECHNICAL FIELD

The various aspects and embodiments described herein pertain generally to a cooling system.

BACKGROUND

When performing a processing such as film formation or etching on a processing target object such as a wafer by plasma processing in a semiconductor manufacturing apparatus, a temperature of the processing target object needs to be adjusted during the processing. For example, a stage described in Patent Document 1 is equipped with a plate and a heat exchanger. The plate has a front surface on which a substrate is placed; and a rear surface. The heat exchanger is configured to supply a heat exchange medium to a plurality of regions on the rear surface of the plate individually and recover the supplied heat exchange medium. The regions on the rear surface are two-dimensionally distributed and are not overlapped with each other.

Patent Document 1: Japanese Patent Laid-open Publication No. 2000-124299

SUMMARY

An exemplary embodiment provides a technique capable of appropriately performing cooling of a processing target object placed on a placing table.

In an exemplary embodiment, a cooling system includes a heat exchange unit provided within a placing table on which a processing target object is placed and configured to perform a heat exchange by a coolant; a compressor configured to compress the coolant; n number of (n is an integer equal to or larger than 2) gas-liquid separating units configured to separate a gas and a liquid included in the coolant; a supply line connected to an inlet of the heat exchange unit; a drain line provided between an outlet of the heat exchange unit and an inlet of the compressor; a gas line provided between an outlet of the compressor and the drain line; n number of liquid lines respectively provided between the supply line and the n number of gas-liquid separating units; n number of cooling lines respectively provided at the n number of gas-liquid separating units; and n number of primary expansion valves and n number of subsidiary expansion valves configured to expand the coolant. The n number of gas-liquid separating units include a first gas-liquid separating unit to a $n^{th}$ gas-liquid separating unit and are provided at the gas line. The first gas-liquid separating unit to the $n^{th}$ gas-liquid separating unit are arranged in sequence from a side of a compressor and connected to the gas line in series. The n number of liquid lines include a first liquid line to a $n^{th}$ liquid line. The first liquid line to the $n^{th}$ liquid line are respectively connected to the first gas-liquid separating unit to the $n^{th}$ gas-liquid separating unit. The n number of cooling lines include a first cooling line to a $n^{th}$ cooling line. The first cooling line to the $n^{th}$ cooling line are respectively extended via the first gas-liquid separating unit to the $n^{th}$ gas-liquid separating unit. The n number of primary expansion valves include a first primary expansion valve to a $n^{th}$ primary expansion valve. The first primary expansion valve to the $n^{th}$ primary expansion valve are respectively provided at the first liquid line to the $n^{th}$ liquid line. The n number of subsidiary expansion valves include a first subsidiary expansion valve to a $n^{th}$ subsidiary expansion valve. The first subsidiary expansion valve to the $n^{th}$ subsidiary expansion valve are respectively provided at the first cooling line to the $n^{th}$ cooling line. Both ends of the first cooling line are connected to a cooling device. The second cooling line to the $n^{th}$ cooling line are provided between the drain line and the first liquid line to the $(n-1)^{th}$ liquid line via the second gas-liquid separating unit to the $n^{th}$ gas-liquid separating unit, respectively.

As stated above, it is possible to provide the technique capable of appropriately carrying out the cooling of the processing target object paced on the placing table.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 13 is a diagram for describing an example of an operation of the cooling system shown in FIG. 10;

DETAILED DESCRIPTION

Figure 1:
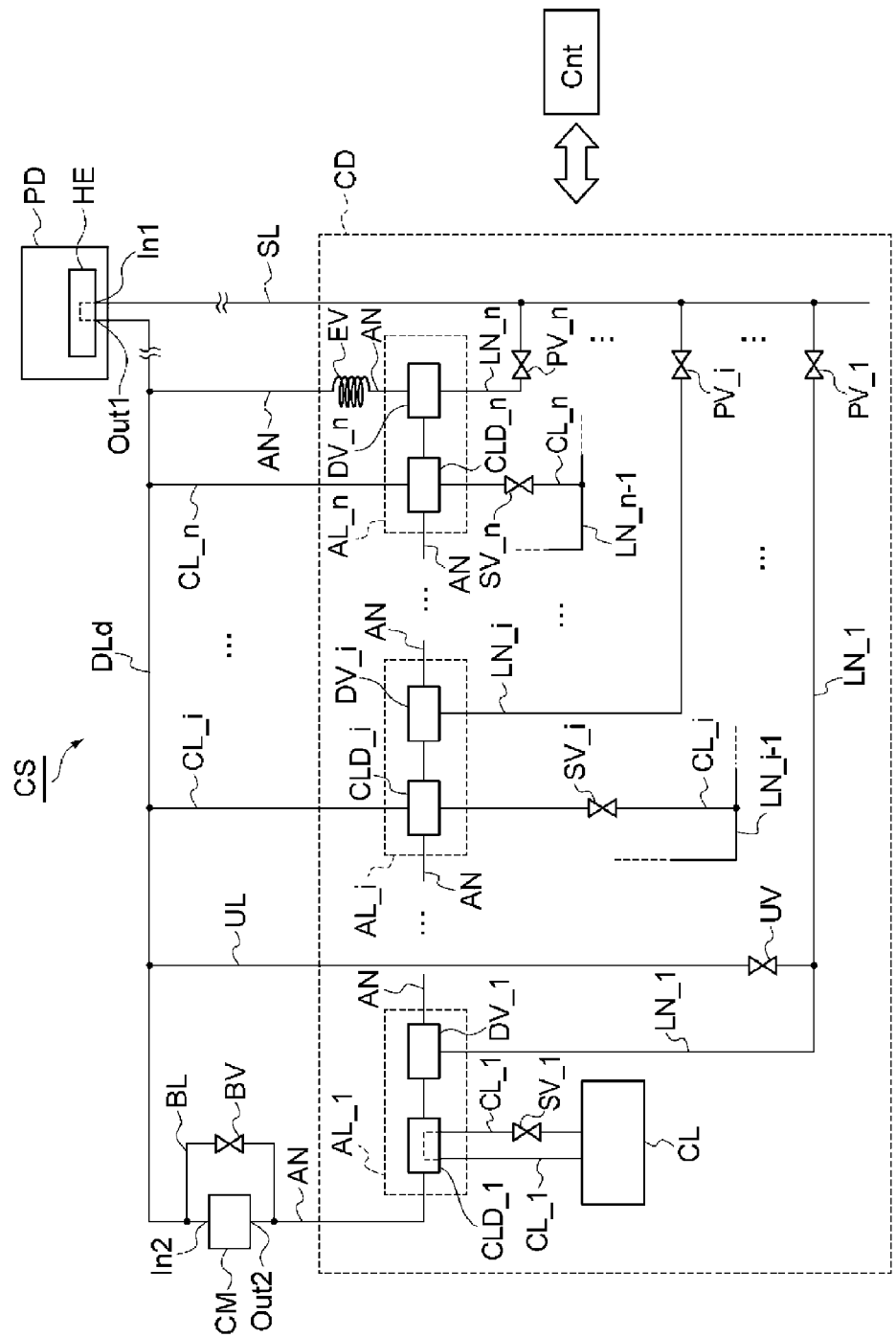
FIG. 1 is a diagram schematically illustrating a configuration of, mainly, a condenser of a cooling system according to the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Description of Exemplary Embodiments

First, exemplary embodiments of the present disclosure will be described. A cooling system according to the present disclosure includes a heat exchange unit provided within a placing table on which a processing target object is placed and configured to perform a heat exchange by a coolant; a compressor configured to compress the coolant; n number of (n is an integer equal to or larger than 2) gas-liquid separating units configured to separate a gas and a liquid included in the coolant; a supply line connected to an inlet of the heat exchange unit; a drain line provided between an outlet of the heat exchange unit and an inlet of the compressor; a gas line provided between an outlet of the compressor and the drain line; n number of liquid lines respectively provided between the supply line and the n number of gas-liquid separating units; n number of cooling lines respectively provided at the n number of gas-liquid separating units; and n number of primary expansion valves and n number of subsidiary expansion valves configured to expand the coolant. The n number of gas-liquid separating units include a first gas-liquid separating unit to a $n^{th}$ gas-liquid separating unit and are provided at the gas line. The first gas-liquid separating unit to the $n^{th}$ gas-liquid separating unit are arranged in sequence from a side of a compressor and connected to the gas line in series. The n number of liquid lines include a first liquid line to a $n^{th}$ liquid line. The first liquid line to the $n^{th}$ liquid line are respectively connected to the first gas-liquid separating unit to the $n^{th}$ gas-liquid separating unit. The n number of cooling lines include a first cooling line to a $n^{th}$ cooling line. The first cooling line to the $n^{th}$ cooling line are respectively extended via the first gas-liquid separating unit to the $n^{th}$ gas-liquid separating unit. The n number of primary expansion valves include a first primary expansion valve to a $n^{th}$ primary expansion valve. The first primary expansion valve to the $n^{th}$ primary expansion valve are respectively provided at the first liquid line to the $n^{th}$ liquid line. The n number of subsidiary expansion valves include a first subsidiary expansion valve to a $n^{th}$ subsidiary expansion valve. The first subsidiary expansion valve to the $n^{th}$ subsidiary expansion valve are respectively provided at the first cooling line to the $n^{th}$ cooling line. Both ends of the first cooling line are connected to a cooling device. The second cooling line to the $n^{th}$ cooling line are provided between the drain line and the first liquid line to the $(n-1)^{th}$ liquid line via the second gas-liquid separating unit to the $n^{th}$ gas-liquid separating unit, respectively.

As described above, the gas-liquid separating units are connected in series. Thus, in case of using the coolants having the different boiling points, the liquid of only one appropriate coolant in the coolants can be sent to the heat exchange unit. Further, since the liquid of the coolant separated from the gas-liquid separating unit directly before the current gas-liquid separating unit can flow to each of the gas-liquid separating units, the cooling in each gas-liquid separating unit is performed by using any one of the coolants. Therefore, it is not needed to use another coolant for the cooling.

The coolant includes a first coolant to a $n^{th}$ coolant, and a boiling point of the first coolant to a boiling point of the $n^{th}$ coolant are lowered in this sequence. By using the plurality of coolants having the different boiling points, temperature adjustment of the placing table can be performed precisely.

The cooling system further includes a control unit configured to control opening/closing of each of the n number of primary expansion valves and the n number of subsidiary expansion valves. The control unit controls the n number of subsidiary expansion valves to be closed when opening only the first primary expansion valve in the n number of primary expansion valves, and the control unit controls, when opening only an $i^{th}$ primary expansion valve (i is an integer equal to or larger than 2 and equal to or smaller than n) in the n number of primary expansion valves, only the first subsidiary expansion valve to a $(i-1)^{th}$ subsidiary expansion valve in the n number of subsidiary expansion valves to be opened. Since the control unit controls opening/closing of the n number of primary expansion valves and the n number of subsidiary expansion valves individually, the required coolant can be supplied to the heat exchange unit efficiently.

A $(n+1)^{th}$ coolant flows in the first cooling line from the cooling device. A temperature of the $(n+1)^{th}$ coolant flowing in the first cooling line is lower than the boiling point of the first coolant and higher than the boiling point of the second coolant within the first gas-liquid separating unit. The control unit controls, when opening only a $j^{th}$ primary expansion valve (j is an integer equal to or larger than 2 and equal to or smaller than $(n-1)$, n is equal to or larger than 3), a temperature of a $(h-1)^{th}$ coolant flowing in a $h^{th}$ cooling line (h is an integer equal to or larger than 2 and equal to or smaller than j) to be lower than a boiling point of a $h^{th}$ coolant and higher than a boiling point of a $(h+1)^{th}$ coolant within a $h^{th}$ gas-liquid separating unit. The control unit controls, when opening only the $n^{th}$ primary expansion valve, a temperature of a $(n-1)^{th}$ coolant flowing in the $n^{th}$ cooling line to be lower than the boiling point of the $n^{th}$ coolant within the $n^{th}$ gas-liquid separating unit. Accordingly, in the gas-liquid separating unit, cooling of the coolant is enabled by a liquid of the coolant separated from the gas-liquid separating unit directly before the current gas-liquid separating unit.

The first gas-liquid separating unit to the $n^{th}$ gas-liquid separating unit are equipped with a first cooling device to a $n^{th}$ cooling device and a first separating device to a $n^{th}$ separating device, respectively. A $k^{th}$ cooling device and a $k^{th}$ separating device provided in a $k^{th}$ gas-liquid separating unit (k is an integer equal to or larger than 1 and equal to or smaller than n) are provided at the gas line, arranged in sequence from the side of the compressor and connected to the gas line in series. A $k^{th}$ cooling line is extended via the $k^{th}$ cooling device. A $k^{th}$ liquid line is connected to the $k^{th}$ separating device.

Details of Exemplary Embodiments

Hereinafter, various exemplary embodiments will be described in detail with reference to the accompanying drawings. Further, in the various drawings, same or corresponding parts will be assigned same reference numerals.

A cooling system CS shown in FIG. 1 is equipped with a placing table PD, a compressor CM, a supply line SL, a drain line DLd, a condenser CD and a control unit Cnt.

The placing table PD is a table configured to place a wafer W (processing target object) thereon. The placing table PD is equipped with a heat exchange unit HE. The heat exchange unit HE is provided within the placing table PD. The heat exchange unit HE is configured to perform a heat exchange by a coolant. The compressor CM is configured to compress the coolant.

The supply line SL is connected to an inlet In1 of the heat exchange unit HE. The drain line DLd is provided between an outlet Out1 of the heat exchange unit HE and an inlet Int of the compressor CM.

The condenser CD is equipped with n number of gas-liquid separating units (n denotes a positive integer equal to or larger than 2); a gas line AN; n number of liquid lines; n number of cooling lines; n number of primary expansion valves; n number of subsidiary expansion valves; and a cooling device CL. The n number of gas-liquid separating units includes a first gas-liquid separating unit AL_1 to a $n^{th}$ gas-liquid separating unit AL_n. The n number of gas-liquid separating units may be represented by an $i^{th}$ gas-liquid separating unit AL_i (i is an integer equal to or larger than 2 and equal to or smaller than n). The gas line AN is provided between an outlet Out2 of the compressor CM and the drain line DLd.

The n number of liquid lines includes a first liquid line LN_1 to a $n^{th}$ liquid line LN_n. The n number of liquid lines may be represented by an $i^{th}$ liquid line LN_i. The n number of cooling lines include a first cooling line CL_1 to a $n^{th}$ cooling line CL_n. The n number of cooling lines may be presented by an $i^{th}$ cooling line CL_i.

The n number of primary expansion valves include a first primary expansion valve PV_1 to a $n^{th}$ primary expansion valve PV_n. The n number of primary expansion valves may be represented by an $i^{th}$ primary expansion valve PV_i. The n number of subsidiary expansion valves include a first subsidiary expansion valve SV_1 to a $n^{th}$ subsidiary expansion valve SV_n. The n number of subsidiary expansion valves may be represented by an $i^{th}$ subsidiary expansion valve SV_i.

Each of the first gas-liquid separating unit AL_1 to the $n^{th}$ gas-liquid separating unit AL_n is configured to separate a gas and a liquid included in the coolant. Each of the first gas-liquid separating unit AL_1 to the $n^{th}$ gas-liquid separating unit AL_n is provided at the gas line AN. The first gas-liquid separating unit AL_1 to the $n^{th}$ gas-liquid separating unit AL_n are arranged in this sequence from the compressor CM side and connected in series on the gas line AN.

The first liquid line LN_1 to the $n^{th}$ liquid line LN_n are provided between the first gas-liquid separating unit AL_1 to the $n^{th}$ gas-liquid separating unit AL_n and the supply line SL, respectively. The first liquid line LN_1 to the $n^{th}$ liquid line LN_n are connected to the first gas-liquid separating unit AL_1 to the $n^{th}$ gas-liquid separating unit AL_n, respectively.

The first cooling line CL_1 to the $n^{th}$ cooling line CL_n are provided at the first gas-liquid separating unit AL_1 to the $n^{th}$ gas-liquid separating unit AL_n, respectively. The first cooling line CL_1 to the $n^{th}$ cooling line CL_n are extended via the first gas-liquid separating unit AL_1 to the $n^{th}$ gas-liquid separating unit AL_n, respectively.

Both ends of the first cooling line CL_1 are connected to the cooling device CL. The second cooling line to the $n^{th}$ cooling line CL_n are provided between the first liquid line LN_1 to the $(n-1)^{th}$ liquid line LN_n-1 and the discharge line DLd via the second gas-liquid separating unit AL_2 to the $n^{th}$ gas-liquid separating unit AL_n, respectively. In this case, the second cooling line is the $i^{th}$ cooling line CL_i when i equals 2 (i=2). The second gas-liquid separating unit is the $i^{th}$ gas-liquid separating unit AL_i when i equals 2 (i=2). The $(n-1)^{th}$ liquid line is the $i^{th}$ liquid line LN_i when i equals n-1 (i=n-1).

The $i^{th}$ cooling line CL_i is provided between the $(i-1)^{th}$ cooling line CL_i-1 and the drain line DLd via the $i^{th}$ gas-liquid separating unit AL_i. The $n^{th}$ cooling line CL_n is provided between the $(n-1)^{th}$ cooling line CL_n-1 and the drain line DLd via the $n^{th}$ gas-liquid separating unit AL_n.

The first primary expansion valve PV_1 to the $n^{th}$ primary expansion valve PV_n are respectively provided at the first liquid line LN_1 to the $n^{th}$ liquid line LN_n. Each of the first primary expansion valve PV_1 to the $n^{th}$ primary expansion valve PV_n expands the coolant.

The first subsidiary expansion valve SV_1 to the $n^{th}$ subsidiary expansion valve SV_n are respectively provided at the first cooling line CL_1 to the $n^{th}$ cooling line CL_n. Each of the first subsidiary expansion valve SV_1 to the $n^{th}$ subsidiary expansion valve SV_n expands the coolant.

The first gas-liquid separating unit AL_1 to the $n^{th}$ gas-liquid separating unit AL_n are equipped with a first cooling device CLD_1 to a $n^{th}$ cooling device CLD_n, respectively. The first gas-liquid separating unit AL_1 to the $n^{th}$ gas-liquid separating unit AL_n are further equipped with a first separating device DV_1 to a $n^{th}$ separating device DV_n, respectively. The $i^{th}$ gas-liquid separating unit AL_i is equipped with an $i^{th}$ cooling device CLD_i and the $i^{th}$ separating device DV_i.

A $k^{th}$ cooling device and a $k^{th}$ separating device belonging to a $k^{th}$ gas-liquid separating unit (k is an integer equal to or larger than 1 and equal to or smaller than n) are provided at the gas line AN. The $k^{th}$ cooling device and the $k^{th}$ separating device are arranged in this sequence from the compressor CM side and connected in series on the gas line AN. In this case, the $k^{th}$ gas-liquid separating unit is the first gas-liquid separating unit AL_1 when k equals 1 (k=1) or the $i^{th}$ gas-liquid separating unit AL_i when k equals i (k=i). The $k^{th}$ cooling device is the first cooling device CLD_1 when k equals 1 (k=1) or the $i^{th}$ cooling device CLD_i when k equals i (k=i). The $k^{th}$ separating device is the first separating device DV_1 when k equals 1 (k=1) or the $i^{th}$ separating device DV_i when k equals i (k=i).

A $k^{th}$ cooling line is extended via the $k^{th}$ cooling device. In this case, the $k^{th}$ cooling line is the first cooling line CL_1 when k equals 1 (k=1) or the $i^{th}$ cooling line when k equals i (k=i).

A $k^{th}$ liquid line is connected to the $k^{th}$ separating device. In this case, the $k^{th}$ liquid line is the first liquid line LN_1 when k equals 1 (k=1) or the $i^{th}$ liquid line when k equals i (k=i).

The control unit Cnt is equipped with a CPU, a ROM, a RAM, and so forth and executes a computer program, which is recorded in a recording medium such as the ROM or the RAM, by the CPU. This computer program includes a program for allowing the CPU to implement a function of controlling the various components of the cooling system CS. The control unit Cnt controls opening/closing of each of the first primary expansion valve PV_1 to the $n^{th}$ primary expansion valve PV_n and opening/closing of each of the first subsidiary expansion valve SV_1 to the $n^{th}$ subsidiary expansion valve SV_n.

The control unit Cnt closes the first subsidiary expansion valve SV_1 to the $n^{th}$ subsidiary expansion valve SV_n when opening only the first primary expansion valve PV_1 among the first to $n^{th}$ primary expansion valves PV_1 to PV_n. The control unit Cnt opens only the first subsidiary expansion valve SV_1 to the $(i-1)^{th}$ subsidiary expansion valve SV_i-1 among the first to $n^{th}$ subsidiary expansion valves SV_1 to SV_n when opening only the $i^{th}$ primary expansion valve PV_i among the first to $n^{th}$ primary expansion valves PV_1 to PV_n.

The coolant, which is supplied into the heat exchange unit HE from the supply line SL to be heat-exchanged in the heat exchange unit HE (hereinafter, sometimes referred to as "coolant R"), includes n kinds of coolants: a first coolant to a $n^{th}$ coolant. Boiling points of the first coolant to the $n^{th}$ coolant are lowered in this sequence. The first coolant has the highest boiling point and the $n^{th}$ coolant has the lowest boiling point.

In the cooling system CS, a $(n+1)^{th}$ coolant is also used. The $(n+1)^{th}$ coolant is supplied into the first cooling line CL_1 from the cooling device CL. The $(n+1)^{th}$ coolant flows in the first cooling line CL_1.

The $(n+1)^{th}$ coolant flows through the first gas-liquid separating unit AL_1 (particularly, the first cooling device CLD_1) via the first cooling line CL_1 and cools the coolant which flows through the first cooling device CLD_1 via the gas line AN. A temperature of the $(n+1)^{th}$ coolant flowing in the first cooling line CL_1 is lower than the boiling point of the first coolant and higher than the boiling point of the second coolant within the first cooling device CLD_1 of the first gas-liquid separating unit AL_1. The $(n+1)^{th}$ coolant may be, by way of example, water. Accordingly, when the control unit Cnt opens only the first primary expansion valve PV_1, only a liquid of the first coolant can be supplied into the heat exchange unit HE via the supply line SL.

The control unit Cnt controls a temperature of a $(h-1)^{th}$ coolant flowing in a $h^{th}$ cooling line (h is an integer equal to or larger than 2 and equal to or smaller than j) as follows when opening only a $j^{th}$ primary expansion valve (j is an integer equal to or larger than 2 and equal to or smaller than n−1, and, here, n is an integer equal to or larger than 3). That is, the control unit Cnt controls the temperature of the $(h-1)^{th}$ coolant flowing in the $h^{th}$ cooling line to be lower than a boiling point of a $h^{th}$ coolant and higher than a boiling point of a $(h+1)^{th}$ coolant within a $h^{th}$ cooling device of a $h^{th}$ gas-liquid separating unit. In this case, the $j^{th}$ primary expansion valve is the $i^{th}$ primary expansion valve PV_i when i equals j (i=j). The $h^{th}$ cooling line is the $i^{th}$ cooling line CL_i when i is equal to or larger than 2 and equal to or smaller than j. The $h^{th}$ gas-liquid separating unit is the $i^{th}$ gas-liquid separating unit AL_i when i is equal to or larger than 2 and equal to or smaller than j. The $h^{th}$ cooling device is the $i^{th}$ cooling device CLD_i when i is equal to or larger than 2 and equal to or smaller than j. Accordingly, only a liquid of the $h^{th}$ coolant can be supplied into the heat exchange unit HE via the supply line SL.

The control unit Cnt controls a temperature of a $(n-1)^{th}$ coolant flowing in the $n^{th}$ cooling line as follows when opening only the $n^{th}$ primary expansion valve. That is, the control unit Cnt controls the temperature of the $(n-1)^{th}$ coolant flowing in the $n^{th}$ cooling line to be lower than a boiling point of the $n^{th}$ coolant within the $n^{th}$ cooling device CLD_n of the $n^{th}$ gas-liquid separating unit AL_n. Accordingly, only a liquid of the $n^{th}$ coolant can be supplied into the heat exchange unit HE via the supply line SL.

The cooling system CS is further equipped with an auxiliary valve UV and an auxiliary line UL. The auxiliary line UL is provided between the first liquid line LN_1 and the drain line DLd. A joint position between the auxiliary line UL and the first liquid line LN_1 is provided between the first separating device DV_1 and a joint position between the first liquid line LN_1 and the second cooling line. The auxiliary valve UV is provided at the auxiliary line UL. The control unit Cnt controls opening/closing of the auxiliary valve UV. The control unit Cnt opens the auxiliary valve UV only when a cooling operation of the cooling system CS is stopped.

The cooling system CS is further equipped with a return line BL and a return valve BV. One end of the return line BL communicates with the inlet Int of the compressor CM, and the other end of the return line BL communicates with the outlet Out2 of the compressor CM. The return valve BV is provided at the return line BL.

(When n Equals 2 (n=2))

Referring to FIG. 2 to FIG. 4B, a case where the condenser CD of the cooling system CS has two gas-liquid separating units (when n=2) will be explained. The coolant R, which is supplied from the supply line SL to be heat-exchanged in the heat exchange unit HE, includes two kinds of coolants: a first coolant and a second coolant. A boiling point of the first coolant is higher than a boiling point of the second coolant. Further, a third coolant flowing in the first cooling line CL_1 is water. A temperature of the water as the third coolant flowing in the first cooling line CL_1 is lower than the boiling point of the first coolant and higher than the boiling point of the second coolant.

Hereinafter, since the description will be provided for the case where n=2, the $i^{th}$ components (for example, the $i^{th}$ gas-liquid separating unit AL_i and so forth) shown in FIG. 1 is not provided. In this case, FIG. 1 illustrates components corresponding to n=2, that is, the second gas-liquid separating unit AL_2, the second cooling device CLD_2, the second separating device DV_2, the second cooling line CL_2, the second liquid line LN_2, the second primary expansion valve PV_2, the second auxiliary expansion valve SV_2. The second cooling line CL_2 is provided between the first liquid line LN_1 and the drain line DLd. A configuration of the cooling system CS when n=2 is depicted in FIG. 2.

Figure 2:
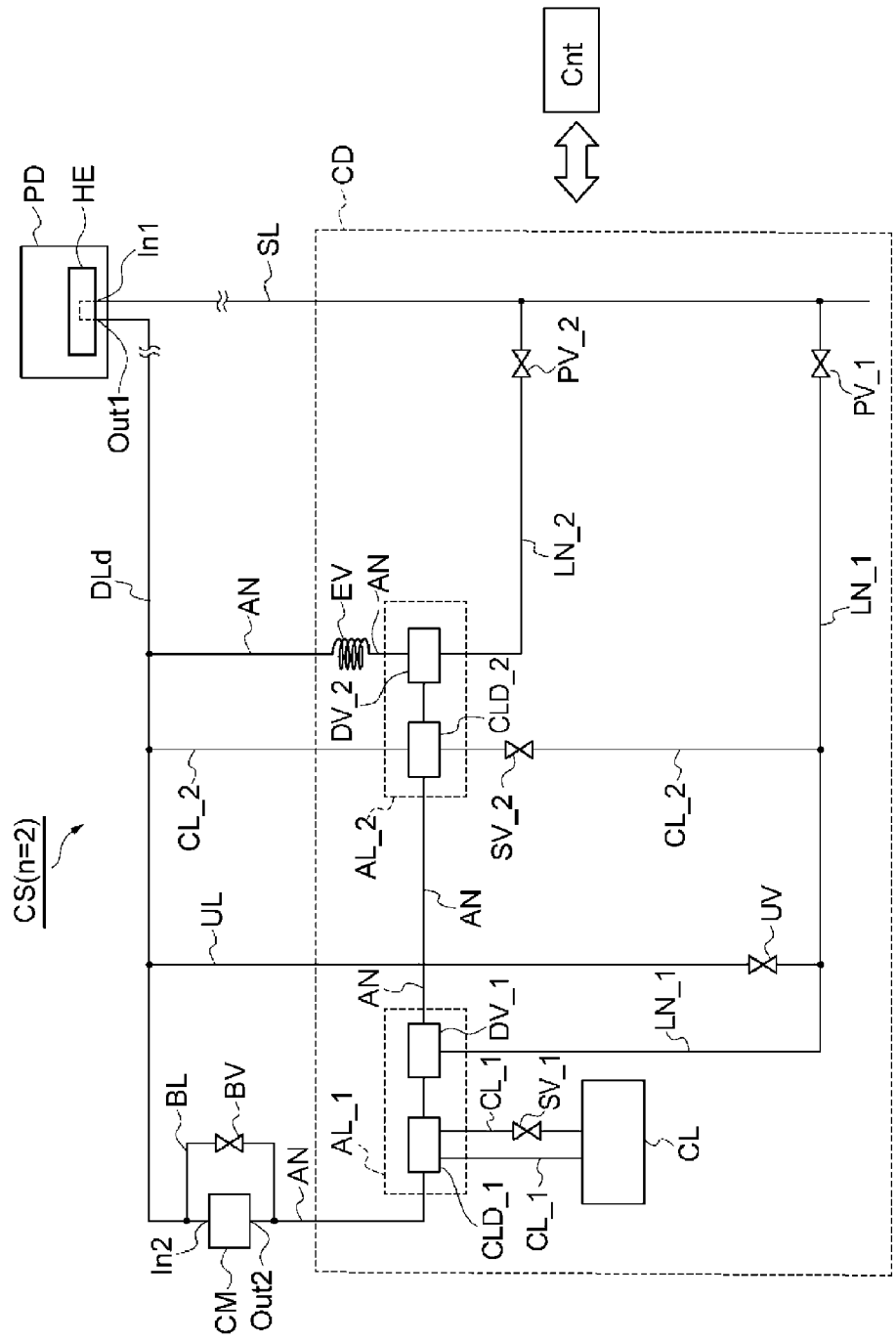
FIG. 2 is a diagram schematically illustrating a configuration where the condenser shown in FIG. 1 has two gas-liquid separating units.
Figure 3:
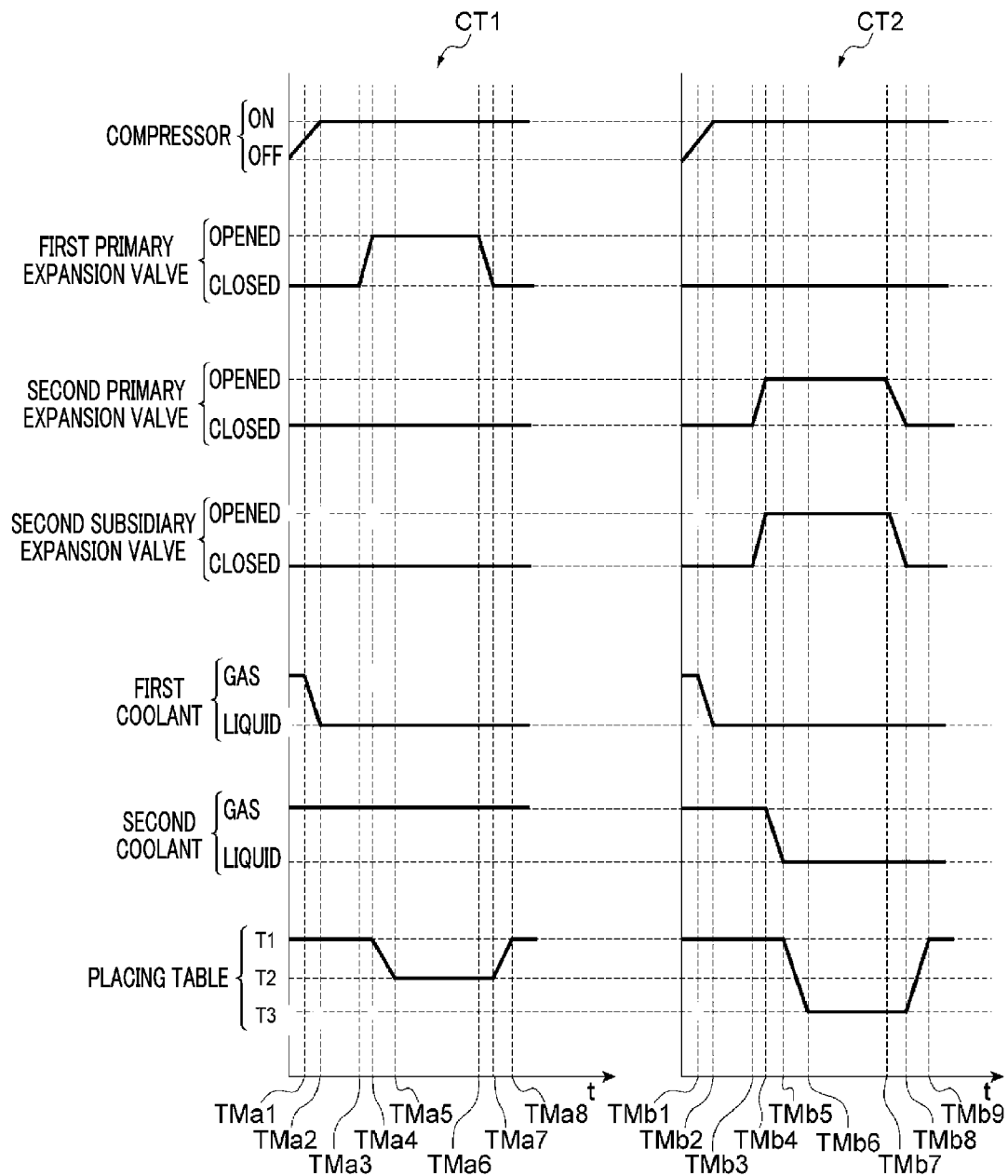
FIG. 3 is a timing chart for describing an operation in the configuration where the condenser shown in FIG. 1 has the two gas-liquid separating units.
Figure 4:
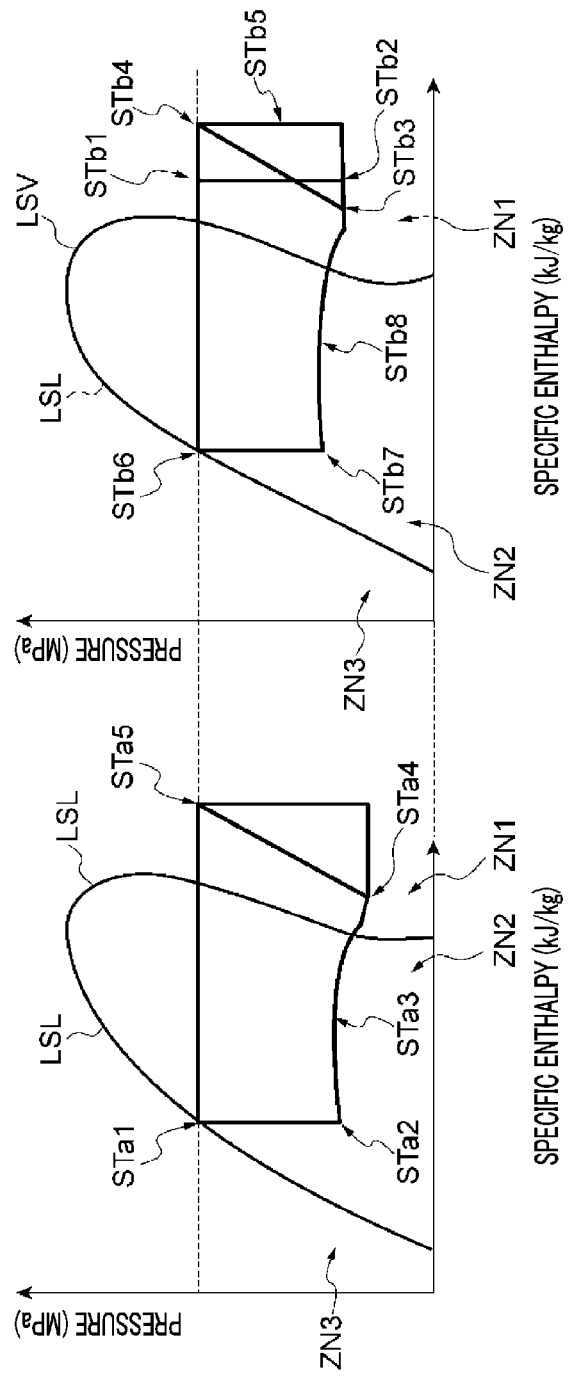
FIG. 4A and FIG. 4B provide Ph charts (Mollier charts) showing a refrigeration cycle of the cooling system according to the present disclosure.

A timing chart CT1 of FIG. 3 corresponds to a case where the coolant, which is supplied from the supply line SL to be heat-exchanged in the heat exchange unit HE, is the first coolant in the cooling system CS shown in FIG. 2, where n=2 (that is, a cooling operation by the first coolant). A timing chart CT2 of FIG. 3 corresponds to a case where the coolant, which is supplied from the supply line SL to be heat-exchanged in the heat exchange unit HE, is the second coolant in the cooling system CS shown in FIG. 2, where n=2 (that is, a cooling operation by the second coolant).

Two horizontal axes in FIG. 3 both represent time (timing). Two vertical axes in FIG. 3 both indicate an operation status (on or off) of the compressor CM and operations statuses (opened or closed) of the first primary expansion valve PV_1, the second primary expansion valve PV_2 and the second subsidiary expansion valve SV_2. The two vertical axes in FIG. 3 both further indicate a temperature of the placing table, and a state (gas or liquid) of each of the first coolant and the second coolant. Operations of the compressor CM, the first primary expansion valve PV_1, the second primary expansion valve PV_2 and the second subsidiary expansion valve SV_2 are controlled by the control unit Cnt.

FIG. 4A is a Ph chart of the first coolant in the cooling system CS shown in FIG. 2 where n=2, and FIG. 4B is a Ph chart of the second coolant in the cooling system CS shown in FIG. 2 where n=2. A horizontal axis in each of FIG. 4A and FIG. 4B represents a specific enthalpy (kJ/kg) and a vertical axis thereof represents a pressure (MPa). In FIG. 4A and FIG. 4B, a saturated liquid line LSL, a saturated vapor line LSV, a superheated vapor zone ZN1, a wet vapor zone ZN2 and a supercooling zone ZN3 are illustrated.

(Cooling Operation by the First Coolant)

The case where the first coolant is heat-exchanged in the heat exchange unit HE will be first explained. The first primary expansion valve PV_1, the second primary expansion valve PV_2, the first subsidiary expansion valve SV_1, the second subsidiary expansion valve SV_2, an exhaust valve EV, the auxiliary valve UV and the return valve BV are kept closed until the control by the control unit Cnt is begun. The control over the first primary expansion valve PV_1, the second primary expansion valve PV_2, the first subsidiary expansion valve SV_1, the second subsidiary expansion valve SV_2, the exhaust valve EV, the auxiliary valve UV and the return valve BV by the control unit Cnt (hereinafter, simply referred to as "control of the control unit Cnt") is begun after the cooling system CS is powered on. To be more specific, the control of the control unit Cnt is begun after a timing TMa2 when the compressor CM is turned on after a timing TMa1 when the cooling system CS is powered on and the compressor CM starts being driven. That is, the compressor CM is turned on at the timing TMa2 after the timing TMa1 when the operation of the compressor CM is begun.

If the cooling system CS is powered on, the cooling device CL is turned on, and the first subsidiary expansion valve SV_1 and the return valve BV are opened. The cooling device CL starts the cooling of the coolant R (a gas of the first coolant and a gas of the second coolant) flowing in the first cooling device CLD_1 of the first gas-liquid separating unit AL_1 via the gas line AN. The water as the third coolant from the cooling device CL is circulated through the first cooling line CL1 via the first subsidiary expansion valve SV_1 and flows through the first cooling device CLD_1 of the first gas-liquid separating unit AL_1. The coolant R (the gas of the first coolant and the gas of the second coolant) is supplied from the compressor CM into the first cooling device CLD_1 of the first gas-liquid separating unit AL_1 via the gas line AN.

The third coolant (water) supplied from the cooling device CL flows through the first cooling device CLD_1 via the first cooling line CL_1 and the first subsidiary expansion valve SV_1 to cool the coolant R (the gas of the first coolant and the gas of the second coolant). A temperature of the third coolant supplied from the cooling device CL is set to TC1 (° C.). The temperature TC1 (° C.) is lower than the boiling point of the first coolant and higher than the boiling point of the second coolant. Therefore, within the first cooling device CLD_1, the temperature of the first coolant reaches the temperature TC1 (° C.) to be liquefied at the timing TMa1, whereas the second coolant of the temperature TC1 (° C.) is maintained in the gas phase. As stated, the first cooling device CLD_1 condenses and liquefies the first coolant (state STa1).

The liquid of the first coolant and the gas of the second coolant are all sent into the first separating device DV_1 from the first cooling device CLD_1. Within the first separating device DV_1, the liquid of the first coolant and the gas of the second coolant are separated (state STa1, state STb1). The first separating device DV_1 sends the liquid of the first coolant into the first liquid line LN_1. The first separating device DV_1 sends the gas of the second coolant into the second cooling device CLD_2 of the second gas-liquid separating unit AL_2 via the gas line AN.

Between a timing TMa3 and a timing TMa4 following the timing TMa2, the first primary expansion valve PV_1 is opened. In this case, though the exhaust valve EV is also opened, the first subsidiary expansion valve SV_1, the second primary expansion valve PV_2 and the auxiliary valve UV are kept closed.

Between the timing TMa4 and a timing TMa6, the liquid of the first coolant is sent into the supply line SL via the first primary expansion valve PV_1, and then, sent into the heat exchange unit HE from the supply line SL. The liquid of the first coolant is expanded and decompressed in the first primary expansion valve PV_1 to reach a temperature lower than the temperature TC1 (° C.) (state STa2), and then, is sent into the heat exchange unit HE via the inlet In1 of the heat exchange unit HE.

The liquid of the first coolant is heat-exchanged in the heat exchange unit HE to be turned into a gas (state STa3). Through this heat exchange, the temperature of the placing table PD reaches T2 (° C.) from T1 (° C.) between the timing TMa4 and a timing TMa5. Here, T2 (° C.) is lower than T1 (° C.).

The temperature of the placing table PD is maintained at T2 (° C.) until a timing TMa7 when the first primary expansion valve PV_1 is closed. The first primary expansion valve PV_1 is closed between the timing TMa6 and the timing TMa7.

The temperature of the placing table PD reaches T1 (° C.) from T2 (° C.) between the timing TMa7 and a timing TMa8.

The gas of the first coolant is sent to the inlet Int of the compressor CM from the outlet Out1 of the heat exchange unit HE via the drain line DLd (state STa4). Further, the gas of the second coolant is also sent to the inlet Int of the compressor CM from the second gas-liquid separating unit AL_2 via the exhaust valve EV (state STb2) and the drain line DLd (state STb3).

The compressor CM compresses the gas of the first coolant and the gas of the second coolant. The gas of the first coolant and the gas of the second coolant compressed by the compressor CM are sent into the gas line AN from the outlet Out2 of the compressor CM (state STa5, state STb4).

The gas of the first coolant and the gas of the second coolant sent into the gas line AN from the outlet Out2 of the compressor CM are mainly sent into the first cooling device CLD_1 of the first gas-liquid separating unit AL_1 via the gas line AN.

A part of the gas of the second coolant sent into the gas line AN from the outlet Out2 of the compressor CM is sent to the inlet Int of the compressor CM via the return line BL and the return valve BV to be compressed again in the compressor CM. The gas of the second coolant flowing in the return line BL is expanded and decompressed by the return valve BV to be sent to the inlet Int of the compressor CM (state STb5). The gas of the first coolant discharged from the outlet Out2 of the compressor CM is also compressed again in the compressor CM, the same as the gas of the second coolant.

(Cooling Operation by the Second Coolant)

Now, the case where the second coolant is heat-exchanged in the heat exchange unit HE will be discussed. The first primary expansion valve PV_1, the second primary expansion valve PV_2, the first subsidiary expansion valve SV_1, the second subsidiary expansion valve SV_2, the exhaust valve EV, the auxiliary valve UV and the return valve BV are kept closed until the control by the control unit Cnt is begun. The control of the control unit Cnt is begun after the cooling system CS is powered on. To be more specific, the control of the control unit Cnt is begun after a timing TMb2 when the compressor CM is turned on after a timing TMb1 when the cooling system CS is powered on and the compressor CM starts being driven. That is, the compressor CM is turned on at the timing TMb2 after the timing TMb1 when the operation of the compressor CM is begun.

If the cooling system CS is powered on, the cooling device CL is turned on, and the first subsidiary expansion valve SV_1 and the return valve BV are opened. The cooling device CL starts the cooling of the coolant R (the gas of the first coolant and the gas of the second coolant) flowing in the first cooling device CLD_1 of the first gas-liquid separating unit AL_1 via the gas line AN. The water as the third coolant from the cooling device CL is circulated through the first cooling line CL1 via the first subsidiary expansion valve SV_1 and flows through the first cooling device CLD_1 of the first gas-liquid separating unit ALL The coolant R (the gas of the first coolant and the gas of the second coolant) is supplied from the compressor CM into the first cooling device CLD_1 of the first gas-liquid separating unit AL_1 via the gas line AN.

The third coolant (water) supplied from the cooling device CL flows through the first cooling device CLD_1 via the first cooling line CL_1 and the first subsidiary expansion valve SV_1 to cool the coolant R (the gas of the first coolant and the gas of the second coolant). The temperature of the third coolant supplied from the cooling device CL is set to TC1 (° C.). The temperature TC1 (° C.) is lower than the boiling point of the first coolant and higher than the boiling point of the second coolant. Therefore, within the first cooling device CLD_1, the temperature of the first coolant reaches the temperature TC1 (° C.) to be liquefied at the timing TMb1, whereas the second coolant of the temperature TC1 (° C.) is maintained in the gas phase. As stated, the first cooling device CLD_1 condenses and liquefies the first coolant.

The liquid of the first coolant and the gas of the second coolant are all sent into the first separating device DV_1 from the first cooling device CLD_1. Within the first separating device DV_1, the liquid of the first coolant and the gas of the second coolant are separated (state STa1, state STb1). The first separating device DV_1 sends the liquid of the first coolant into the first liquid line LN_1. The first separating device DV_1 sends the gas of the second coolant into the second cooling device CLD_2 of the second gas-liquid separating unit AL_2 via the gas line AN.

Between a timing TMb3 and a timing TMb4 following the timing TMb2, the second primary expansion valve PV_2 and the second subsidiary expansion valve SV_2 are opened. In this case, though the exhaust valve EV is also opened, the first primary expansion valve PV_1 and the auxiliary valve UV are kept closed.

The liquid of the first coolant flows through the second cooling line CL_2 via the second subsidiary expansion valve SV_2, and then, is sent into the compressor CM via the drain line DLd after passing through the second cooling device CLD_2 of the second gas-liquid separating unit AL_2. The gas of the second coolant is supplied into the second cooling device CLD_2 of the second gas-liquid separating unit AL_2 from the first separating device DV_1 of the first gas-liquid separating unit AL_1 to flow through the second cooling device CLD_2.

The liquid of the first coolant is expanded and decompressed by the second subsidiary expansion valve SV_2 to reach a temperature TC2 (° C.) lower than TC1 (° C.) (state STa2). The temperature TC2 (° C.) is lower than the boiling point of the second coolant. The first coolant of the temperature TC2 (° C.) flows through the second cooling device CLD_2 (state STa3). Therefore, in the second cooling device CLD_2, the temperature of the second coolant reaches the temperature TC2 (° C.) to be liquefied between the timing TMb4 and a timing TMb5. In this way, the second cooling device CLD_2 condenses and liquefies the second coolant (state STb6).

The liquid of the second coolant is sent into the second separating device DV_2 from the second cooling device CLD_2. In the second separating device DV_2, the liquid of the second coolant is separated from the gas (gas component included in the second cooling device CLD_2 and the second separating device DV_2) (state STb6). The second separating device DV_2 sends the liquid of the second coolant into the second liquid line LN_2. The second separating device DV_2 sends the separated gas from the gas line AN into the drain line DLd via the exhaust valve EV.

Between the timing TMb5 and a timing TMb7, the liquid of the second coolant is sent into the supply line SL via the second primary expansion valve PV_2, and then, sent into the heat exchange unit HE from the supply line SL. The liquid of the second coolant is expanded and decompressed by the second primary expansion valve PV_2 to reach a temperature lower than the temperature TC2 (° C.) (state STb7), and then, is sent into the heat exchange unit HE via the inlet In1 of the heat exchange unit HE.

The liquid of the second coolant is heat-exchanged in the heat exchange unit HE to be turned into a gas (state STb8). Through this heat exchange, the temperature of the placing table PD reaches a temperature T3 (° C.) from T1 (° C.) between the timing TMb5 and a timing TMb6. Here, the temperature T3 (° C.) is lower than T1 (° C.) and T2 (° C.).

The temperature of the placing table PD is maintained at T3 (° C.) until a timing TMb8 when the second primary expansion valve PV_2 and the second subsidiary expansion valve SV_2 are closed. The second primary expansion valve PV_2 and the second subsidiary expansion valve SV_2 are closed between the timing TMb7 and the timing TMb8. The temperature of the placing table PD reaches T1 (° C.) from T3 (° C.) between the timing TMb8 and a timing TMb9.

The gas of the second coolant is sent to the inlet Int of the compressor CM from the outlet Out1 of the heat exchange unit HE via the drain line DLd (state STb3). Further, the liquid of the first coolant is also sent to the inlet Int of the compressor CM from the second cooling line CL_2 via the second cooling device CLD_2 of the second gas-liquid separating unit AL_2 (state STa3) and the drain line DLd (state STa4).

The compressor CM is configured to compress the gas of the first coolant and the gas of the second coolant. The gas of the first coolant and the gas of the second coolant compressed by the compressor CM are sent into the gas line AN from the outlet Out2 of the compressor CM (state STa5, state STb4).

The gas of the first coolant and the gas of the second coolant sent into the gas line AN from the outlet Out2 of the compressor CM are mainly sent to the first cooling device CLD_1 of the first gas-liquid separating unit AL_1 via the gas line AN.

A part of the gas of the second coolant sent into the gas line AN from the outlet Out2 of the compressor CM is sent to the inlet Int of the compressor CM via the return line BL and the return valve BV to be compressed again in the compressor CM. The gas of the second coolant flowing in the return line BL is expanded and decompressed by the return valve BV, and then, sent to the inlet Int of the compressor CM (state STb5). The gas of the first coolant discharged from the outlet Out2 of the compressor CM is also compressed again in the compressor CM, the same as the gas of the second coolant.

Further, by continuously performing the cooling operation by the second coolant after the cooling operation by the first coolant, the temperature of the placing table PD can be reduced more rapidly. In the state that the temperature of the placing table PD is sufficiently reduced through the cooling operation by the first coolant, the temperature of the placing table PD can be further reduced by performing the cooling operation by the second coolant. In this case, operations shown in the timing chart CT1 and the timing chart CT2 are continuously performed while setting the timing TMa7 of the timing chart CT1 and the timing TMb3 of the timing chart CT2 as the same timing.

(When Cooling Operation is Stopped)

Now, a case where the cooling operation is stopped will be discussed. In this case, neither the liquid of the first coolant nor the liquid of the second coolant is supplied to the heat exchange unit HE, and the heat exchange is not performed in the heat exchange unit HE. Even in this period during which the cooling operation is stopped, the circulation of the coolant R is continued to maintain the function of the compressor CM or the like.

The first subsidiary expansion valve SV_1, the exhaust valve EV, the auxiliary valve UV and the return valve BV are opened. The first primary expansion valve PV_1, the second primary expansion valve PV_2 and the second subsidiary expansion valve SV_2 are closed.

The cooling device CL performs the cooling of the coolant R (the gas of the first coolant and the gas of the second coolant) flowing in the first cooling device CLD_1 of the first gas-liquid separating unit AL_1 via the gas line AN. The water as the third coolant from the cooling device CL is circulated through the first cooling line CL_1 via the first subsidiary expansion valve SV_1 and flows through the first cooling device CLD_1 of the first gas-liquid separating unit AL_1. The coolant R (the gas of the first coolant and the gas of the second coolant) is supplied from the compressor CM into the first cooling device CLD_1 of the first gas-liquid separating unit AL_1 via the gas line AN.

The third coolant (water) supplied from the cooling device CL flows through the first cooling device CLD_1 via the first cooling line CL_1 and the first subsidiary expansion valve SV_1 to cool the coolant R (the gas of the first coolant and the gas of the second coolant). The temperature of the third coolant supplied from the cooling device CL is TC1 (° C.). The temperature TC1 (° C.) is lower than the boiling point of the first coolant and higher than the boiling point of the second coolant. Accordingly, in the first cooling device CLD_1, though the temperature of the first coolant reaches the temperature TC1 (° C.) to be liquefied at the timing TMa1, the second coolant of the temperature TC1 (° C.) is maintained in the gas phase. In this way, the first cooling device CLD_1 condenses and liquefies the first coolant.

The liquid of the first coolant and the gas of the second coolant are all sent into the first separating device DV_1 from the first cooling device CLD_1. Within the first separating device DV_1, the liquid of the first coolant and the gas of the second coolant are separated. The first separating device DV_1 sends the liquid of the first coolant into the first liquid line LN_1. The first separating device DV_1 sends the gas of the second coolant into the second cooling device CLD_2 of the second gas-liquid separating unit AL_2 via the gas line AN.

The liquid of the first coolant is sent into the drain line DLd via the auxiliary line UL and the auxiliary valve UV, and then, sent to the inlet Int of the compressor CM. The gas of the second coolant is sent into the drain line DLd via the second gas-liquid separating unit AL_2 and the exhaust valve EV via the gas line AN, and then, sent to the inlet Int of the compressor CM.

A part of the gas of the second coolant sent into the gas line AN from the outlet Out2 of the compressor CM is sent to the inlet Int of the compressor CM via the return line BL and the return valve BV to be compressed again in the compressor CM. The gas of the second coolant flowing in the return line BL is expanded and decompressed by the return valve BV, and then, sent to the inlet Int of the compressor CM. The gas of the first coolant discharged from the outlet Out2 of the compressor CM is also compressed again in the compressor CM, the same as the gas of the second coolant.

According to the above-described cooling system CS, the gas-liquid separating units are connected in series. Thus, in case of using the coolants having the different boiling points, the liquid of only one appropriate coolant in the coolants can be sent to the heat exchange unit HE. Further, since the liquid of the coolant separated from the gas-liquid separating unit directly before the current gas-liquid separating unit can flow to each of the gas-liquid separating units, the cooling in each gas-liquid separating unit is performed by using any one of the coolants. Therefore, it is not needed to use another coolant for the cooling. Furthermore, the temperature adjustment of the placing table PD can be precisely carried out by using the coolants having the different boiling points. Furthermore, since the control unit Cnt controls the opening/closing of each of the n number of primary expansion valves and the n number of subsidiary expansion valves, the required coolant can be supplied to the heat exchange unit HE with high efficiency. Moreover, in the gas-liquid separating unit, the cooling of the coolant is enabled by the liquid of the coolant separated from the gas-liquid separating unit directly before the current gas-liquid separating unit.

Figure 5:
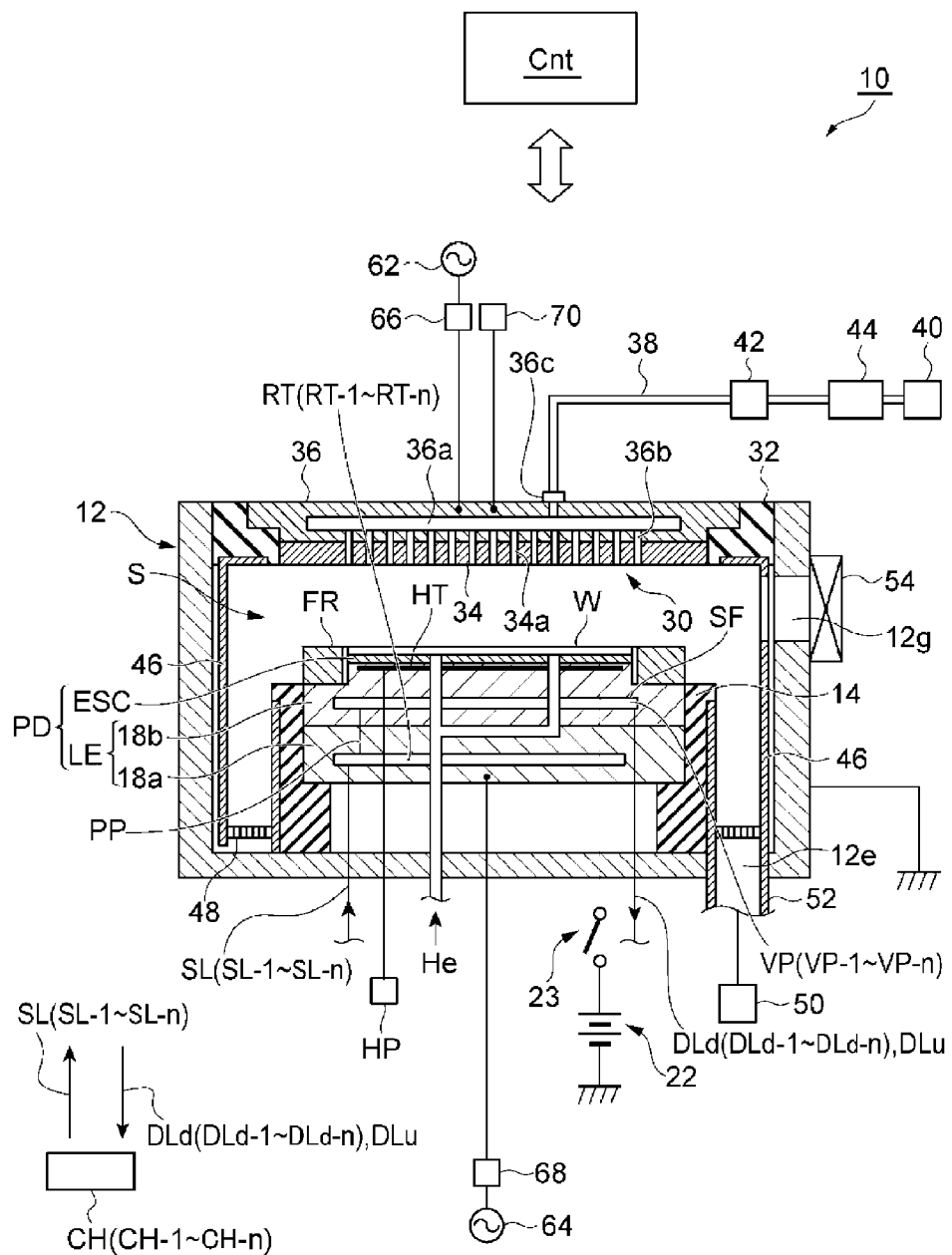
FIG. 5 is a diagram schematically illustrating an example of a configuration of a plasma processing apparatus to which the cooling system according to the present disclosure is applied.

The cooling system CS shown in FIG. 1 is applicable to the plasma processing apparatus 10 illustrated in FIG. 5. The condenser CD of the cooling system CS shown in FIG. 1 can be applied to the condenser CD shown in FIG. 6, FIG. 9, FIG. 10, FIG. 14 and FIG. 15 and the condenser CD_1 to the condenser CD_n shown in FIG. 17.

In the following, cooling systems CS according to a first exemplary embodiment to a fifth exemplary embodiment to which the condenser CD shown in FIG. 1 is applicable will be explained. The cooling systems CS according to the first exemplary embodiment to the fifth exemplary embodiment can be used in a plasma processing apparatus 10 shown in FIG. 5. First, referring to FIG. 5, a configuration of the plasma processing apparatus 10 to which the cooling systems CS according to the first exemplary embodiment to the fifth exemplary embodiment are applicable will be explained.

The plasma processing apparatus 10 shown in FIG. 5 is a plasma etching apparatus equipped with a parallel plate type electrode, and has a processing vessel 12. The processing vessel 12 has, for example, a cylindrical shape. The processing vessel 12 is made of, by way of non-limiting example, aluminum, and an inner wall surface of the processing vessel 12 is anodically oxidized. The processing vessel 12 is frame-grounded.

A substantially cylindrical supporting member 14 is provided on a bottom portion of the processing vessel 12. The supporting member 14 is made of, by way of example, but not limitation, an insulating material. The insulating material forming the supporting member 14 may contain oxygen, such as quartz. Within the processing vessel 12, the supporting member 14 is vertically extended from the bottom portion of the processing vessel 12 (toward an upper electrode 30).

A placing table PD is provided within the processing vessel 12. The placing table PD is supported by the supporting member 14. The placing table PD is configured to hold a wafer W on a top surface of the placing table PD. The placing table PD includes a lower electrode LE and an electrostatic chuck ESC.

The lower electrode LE is provided with a first plate 18a and a second plate 18b. The first plate 18a and the second plate 18b are made of a metal such as, but not limited to, aluminum, and have a substantially disk shape. The second plate 18b is provided on the first plate 18a and electrically connected with the first plate 18a. The electrostatic chuck ESC is provided on the second plate 18b.

The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

Figure 6:
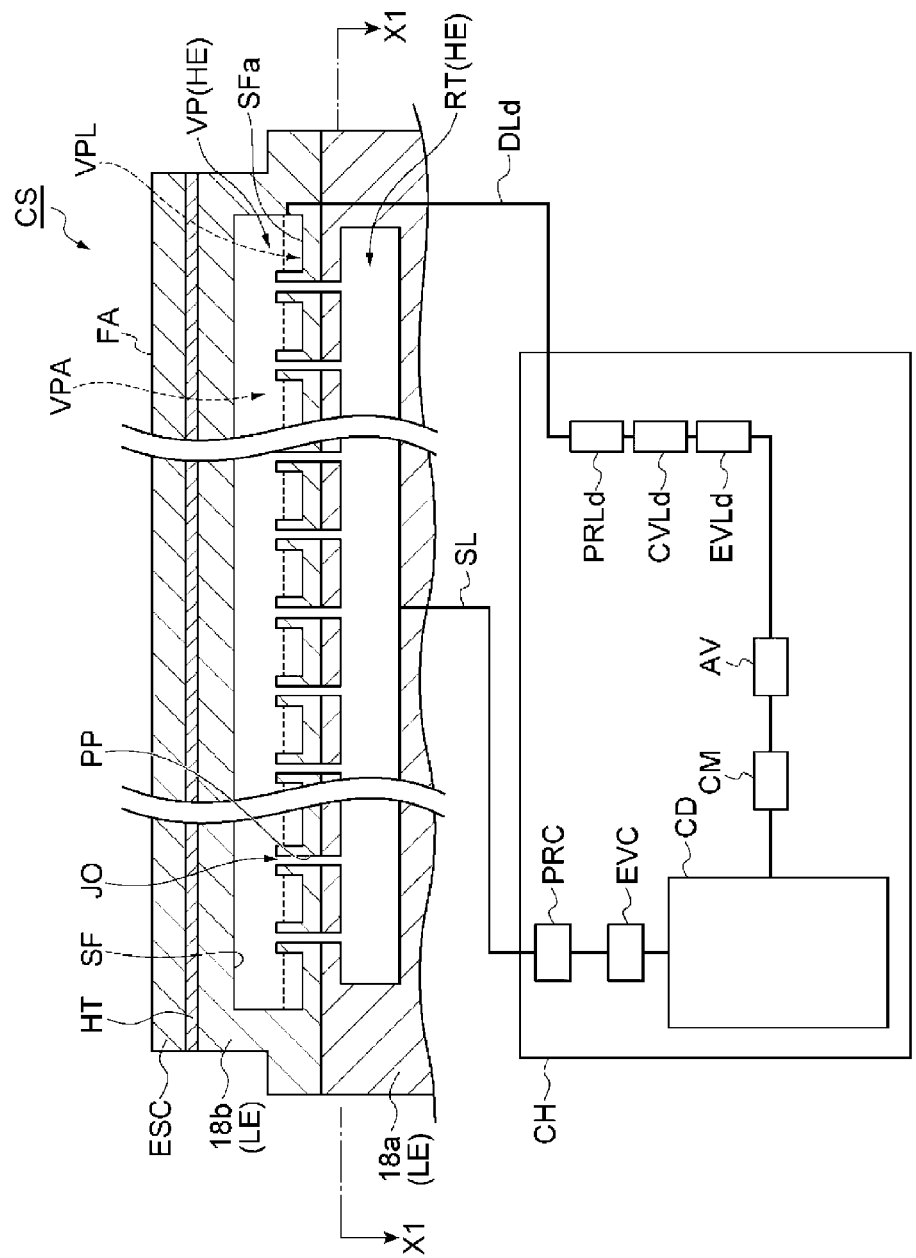
FIG. 6 is a diagram illustrating a configuration (first exemplary embodiment) of the cooling system according to the present disclosure.
Figure 14:
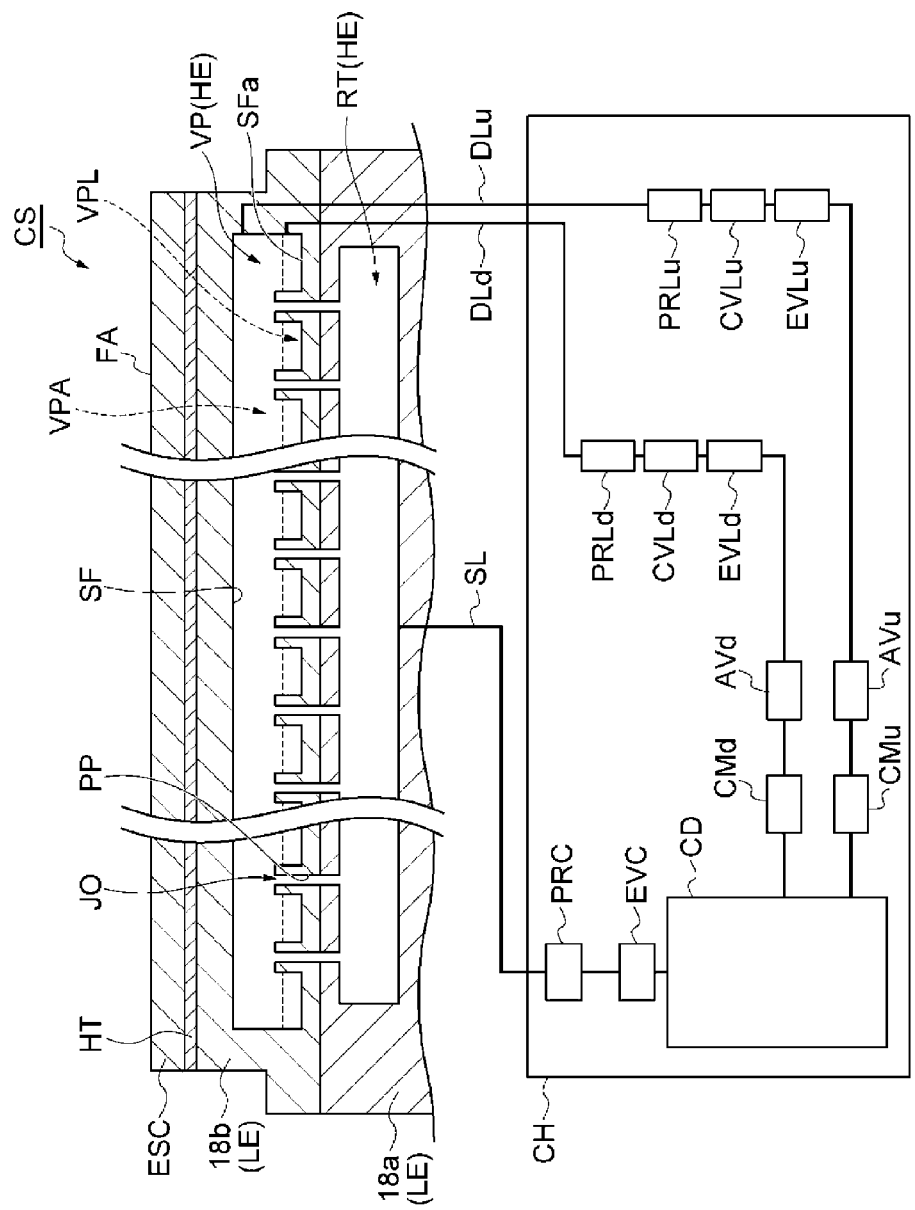
FIG. 14 is a diagram illustrating yet another configuration (third exemplary embodiment) of the cooling system according to the present disclosure.

An evaporation chamber VP shown in FIG. 6 and FIG. 14 (or branch chambers VP-1 to VP-n shown in FIG. 10, FIG. 15 and FIG. 17) is provided within the second plate 18b. A heat transfer wall SF of the evaporation chamber VP evaporates a coolant, so that a temperature of the electrostatic chuck ESC on the heat transfer wall SF of the evaporation chamber VP is lowered. Accordingly, the evaporation chamber VP is capable of cooling the wafer W placed on the electrostatic chuck ESC. A reservoir chamber RT shown in FIG. 6 and FIG. 14 (or branch chambers RT-1 to RT-n shown in FIG. 10, FIG. 15 and FIG. 17) is provided within the first plate 18a. The reservoir chamber RT stores therein the coolant which is supplied to the evaporation chamber VP.

Further, in the present specification, a phase change from a solid or a liquid into a gas is referred to as "vaporization," and the vaporization taking place only on a surface of the solid or the liquid is referred to as "evaporation." Further, the vaporization taking place from the inside of the liquid is referred to as "boiling." When the coolant is discharged to be come into contact with the heat transfer wall, the coolant evaporates from the liquid phase into the gas phase. At this moment, a caloric power called latent heat or heat of vaporization is transferred from the heat transfer wall to the coolant.

Figure 17:
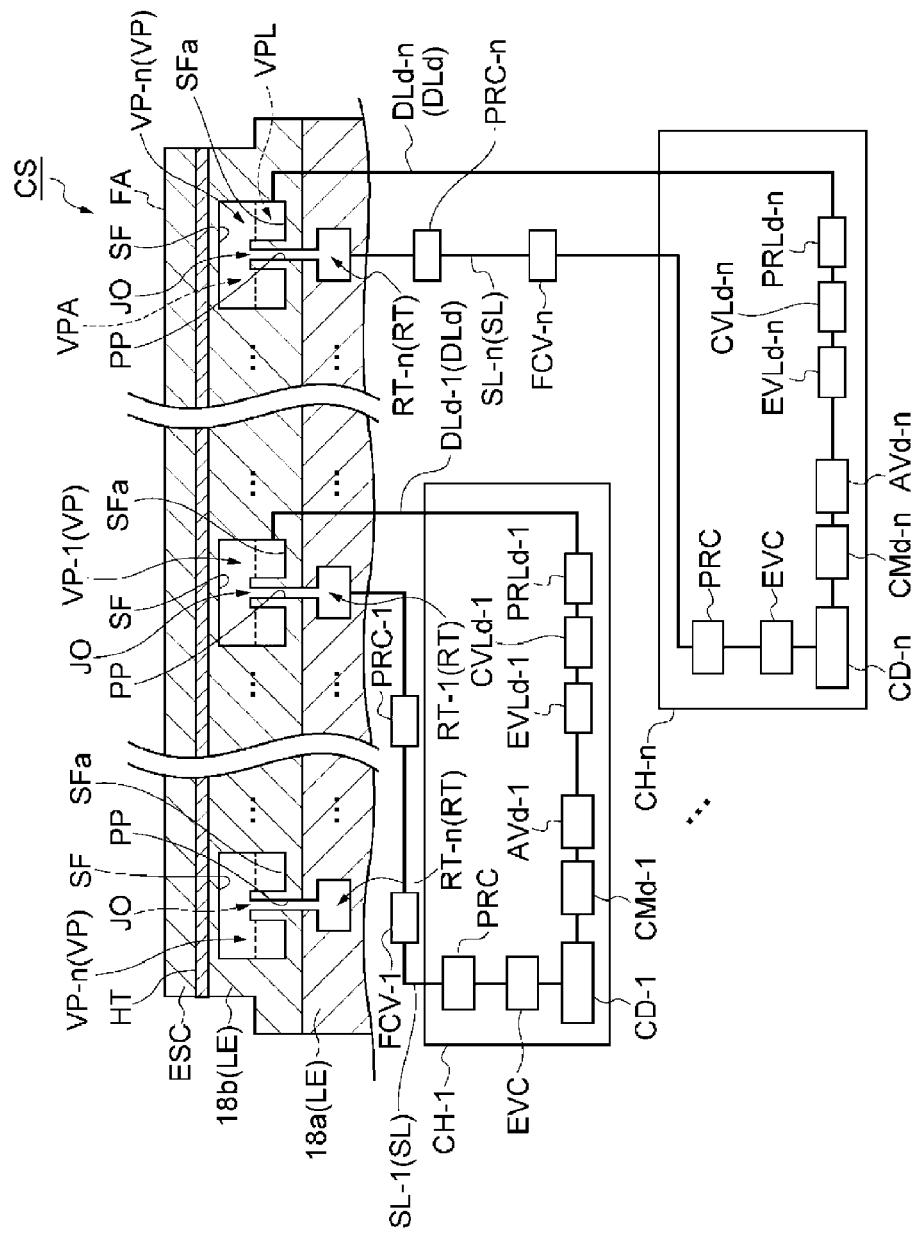
FIG. 17 is a diagram illustrating still yet another configuration (fifth exemplary embodiment) of the cooling system according to the present disclosure.

The plasma processing apparatus 10 includes a chiller unit CH shown in FIG. 6, FIG. 10, FIG. 14 and FIG. 15 (or chiller units CH-1 to CH-n shown in FIG. 17). The chiller unit CH is configured to cool the wafer W placed on the electrostatic chuck ESC by circulating the coolant via a supply line SL, the reservoir chamber RT, the evaporation chamber VP and a drain line DLd to lower the temperature of the electrostatic chuck ESC.

Figure 10:
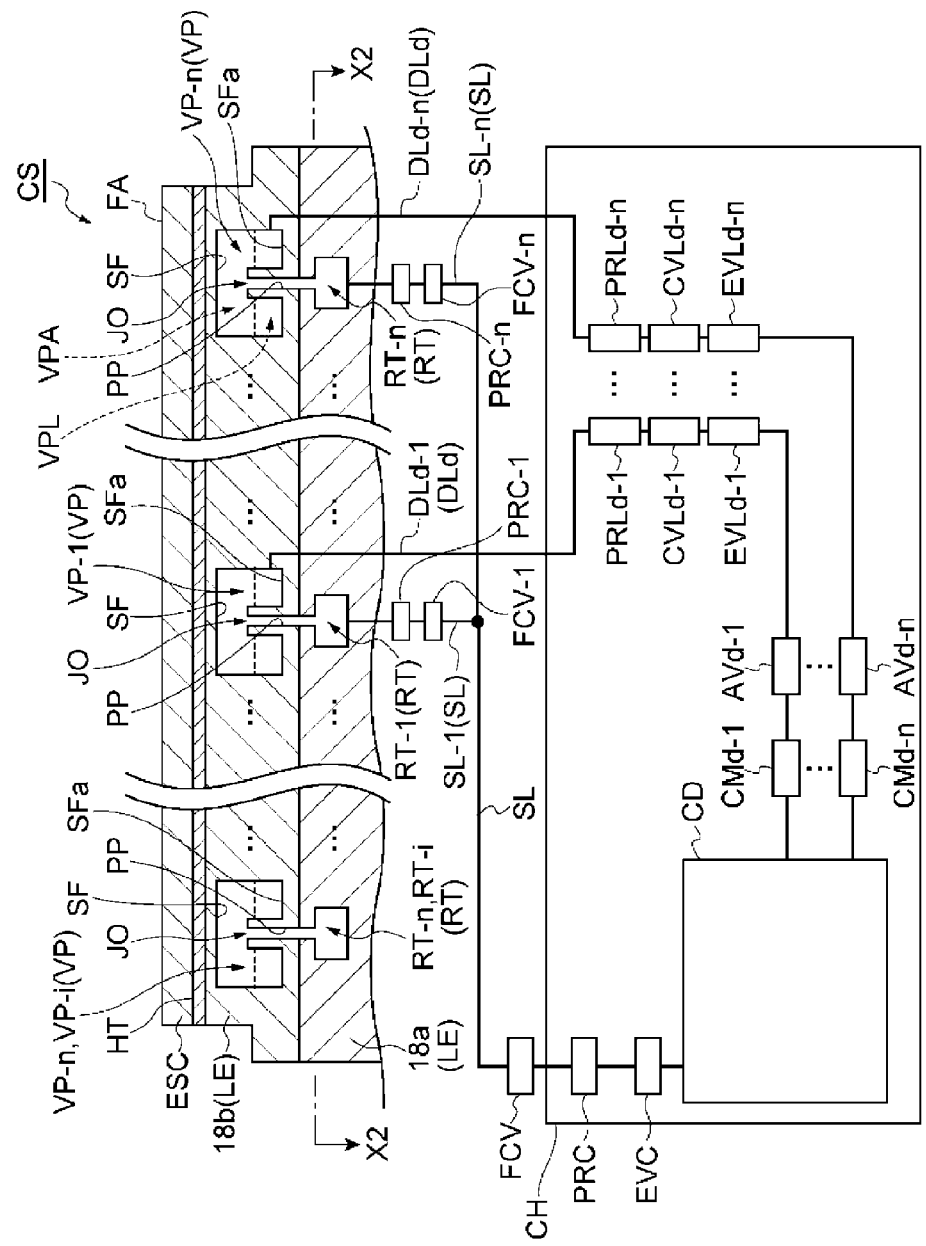
FIG. 10 is a diagram illustrating another configuration (second exemplary embodiment) of the cooling system according to the present disclosure.
Figure 15:
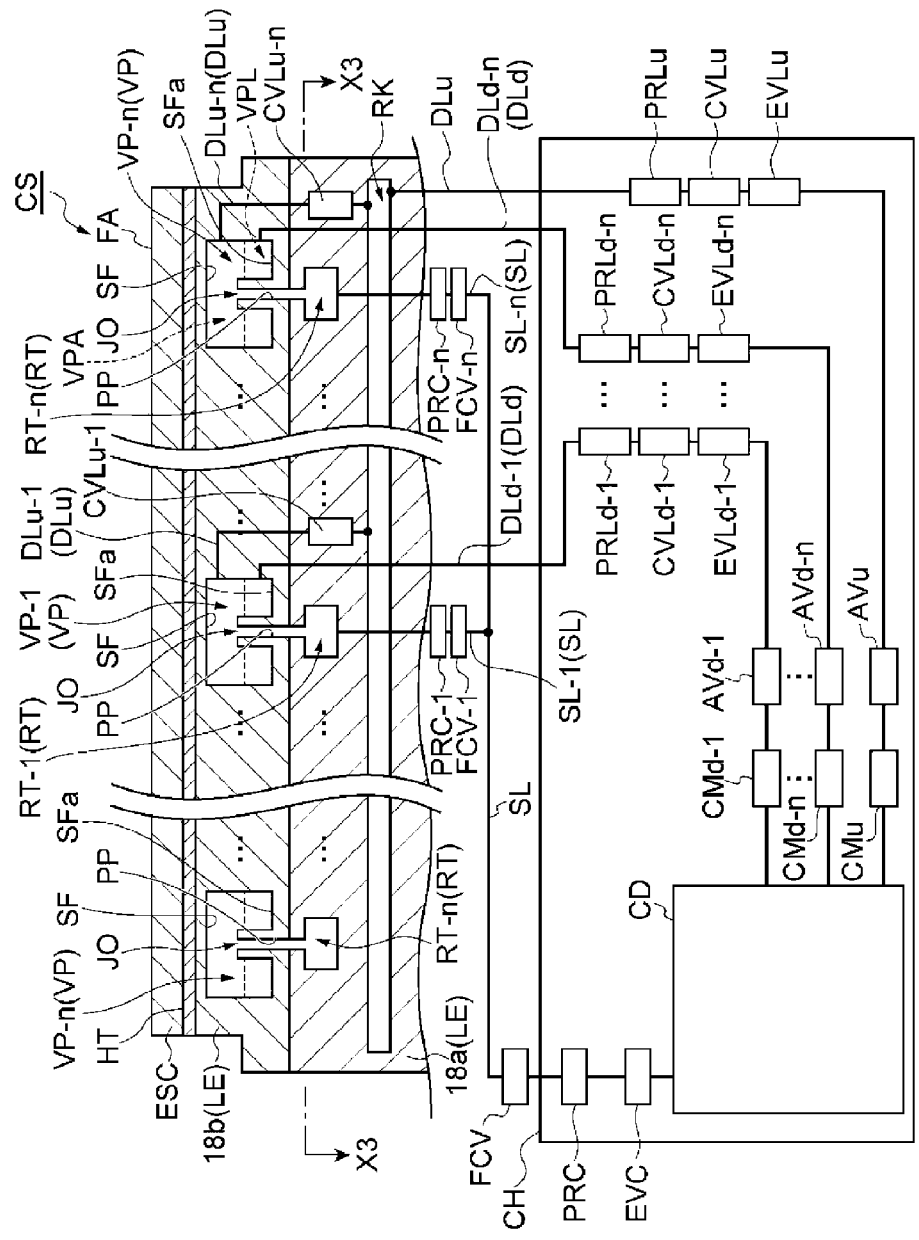
FIG. 15 is a diagram illustrating still yet another configuration (fourth exemplary embodiment) of the cooling system according to the present disclosure.

The coolant is supplied into the reservoir chamber RT from the chiller unit CH via the supply line SL (or branch lines SL-1 to SL-n shown in FIG. 10, FIG. 15 and FIG. 17). The coolant is drained into the chiller unit CH from the evaporation chamber VP via the drain line DLd (or branch lines DLd-1 to DLd-n shown in FIG. 10, FIG. 15 and FIG. 17 and a drain line DLu shown in FIG. 14 and FIG. 15).

The plasma processing apparatus 10 includes a cooling system CS equipped with the aforementioned evaporation chamber VP, the reservoir chamber RT and the chiller unit CH. A specific configuration of the cooling system CS will be described later.

Furthermore, the plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

The plasma processing apparatus 10 is provided with a heater HT as a heating element. The heater HT is embedded in, for example, the second plate 18b. The heater HT is connected to a heater power supply HP.

As a power is supplied to the heater HT from the heater power supply HP, a temperature of the placing table PD is adjusted, and, ultimately, a temperature of the wafer W placed on the placing table PD is adjusted. Further, the heater HT may be embedded in the electrostatic chuck ESC.

The plasma processing apparatus 10 includes an upper electrode 30. The upper electrode 30 is provided above the placing table PD, facing the placing table PD. The lower electrode LE and the upper electrode 30 are arranged to be substantially parallel to each other. Formed between the upper electrode 30 and the lower electrode LE is a processing space S in which a plasma processing is performed on the wafer W.

The upper electrode 30 is supported at an upper portion of the processing vessel 12 with an insulating shield member 32 therebetween. The insulating shield member 32 may be made of an insulating material, such as quartz, containing oxygen. The upper electrode 30 may include an electrode plate 34 and an electrode supporting body 36.

The electrode plate 34 is directly contacted with the processing space S, and is provided with multiple gas discharge holes 34a. In an exemplary embodiment, the electrode plate 34 contains silicon. In other exemplary embodiments, the electrode plate 34 may contain silicon oxide.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36.

Multiple gas through holes 36b are extended downwards from the gas diffusion space 36a (toward the placing table PD), and these gas through holes 36b communicate with the gas discharge holes 34a, respectively. The electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources.

The valve group 42 includes a plurality of valves, and the flow rate controller group 44 includes a plurality of flow rate controllers such as mass flow controllers. Each of the gas sources belonging to the gas source group 40 is connected to the gas supply line 38 via a corresponding valve belonging to the valve group 42 and a corresponding flow rate controller belonging to the flow rate controller group 44.

With this configuration, the plasma processing apparatus 10 is capable of supplying gases from one or more gas sources selected from the plurality of gas sources belonging to the gas source group 40 into the processing vessel 12 at individually controlled flow rates.

In the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$. The deposition shield may be made of, besides the $Y_2O_3$, an oxygen-containing material such as, but not limited to, quartz.

At a side of the bottom portion of the processing vessel 12 (a side where the supporting member 14 is provided), a gas exhaust plate 48 is provided between the supporting member 14 and a sidewall of the processing vessel 12. The gas exhaust plate 48 may be made of, by way of example, an aluminum member coated with ceramics such as $Y_2O_3$. The processing vessel 12 is also provided with a gas exhaust opening 12e under the gas exhaust plate 48. The gas exhaust opening 12e is connected with a gas exhaust device 50 via a gas exhaust line 52.

The gas exhaust device 50 includes a vacuum pump such as a turbo molecular pump, and is capable of decompressing a space within the processing vessel 12 to a required vacuum level. Further, a carry-in/out opening 12g for the wafer W is provided at the side wall of the processing vessel 12, and the carry-in/out opening 12g is opened or closed by a gate valve 54.

The plasma processing apparatus 10 further includes a first high frequency power supply 62 and a second high frequency power supply 64. The first high frequency power supply 62 is configured to generate a first high frequency power for plasma generation having a frequency ranging from 27 MHz to 100 MHz, for example, 60 MHz. The first high frequency power supply 62 is connected to the upper electrode 30 via a matching device 66. The matching device 66 is a circuit configured to match an output impedance of the first high frequency power supply 62 and an input impedance at a load side (lower electrode LE side). Further, the first high frequency power supply 62 may be connected to the lower electrode LE via the matching device 66.

The second high frequency power supply 64 is configured to generate a second high frequency power for ion attraction into the wafer W, that is, a high frequency bias power having a frequency ranging from 400 kHz to 40.68 MHz, for example, 13.56 MHz. The second high frequency power supply 64 is connected to the lower electrode LE via a matching device 68. The matching device 68 is a circuit configured to match an output impedance of the second high frequency power supply 64 and the input impedance at the load side (lower electrode LE).

The plasma processing apparatus 10 is further equipped with a power supply 70. The power supply 70 is connected to the upper electrode 30. The power supply 70 is configured to apply, to the upper electrode 30, a voltage for attracting positive ions existing in the processing space S into the electrode plate 34. As an example, the power supply 70 may be a DC power supply configured to generate a negative DC voltage. If such a voltage is applied to the upper electrode 30 from the power supply 70, the positive ions existing in the processing space S collide with the electrode plate 34. Accordingly, secondary electrons and/or silicon may be released from the electrode plate 34.

In the present disclosure, the plasma processing apparatus 10 may further include the control unit Cnt shown in FIG. 1. The control unit Cnt is connected to the valve group 42, the flow rate controller group 44, the gas exhaust device 50, the first high frequency power supply 62, the matching device 66, the second high frequency power supply 64, the matching device 68, the power supply 70, the heater power supply HP and the chiller unit CH (or the chiller units CH-1 to CH-n).

The control unit Cnt may control, by using control signals, selection and a flow rate of the gas supplied from the gas source group 40, the gas exhaust by the gas exhaust device 50, the power supplies from the first high frequency power supply 62 and the second high frequency power supply 64, the voltage application from the power supply 70, the power supply from the heater power supply HP, a flow rate of a coolant supplied from the chiller unit CH (or the chiller units CH-1 to CH-n) to the evaporation chamber VP, and so forth.

The control unit Cnt is equipped with a CPU, a ROM, a RAM, and so forth, and the CPU executes a computer program stored in a memory device such as the ROM or the RAM. This computer program includes a program for allowing the CPU to perform a function of controlling an overall operation of the plasma processing apparatus 10. Particularly, this computer program includes a program for allowing the CPU of the control unit Cnt to implement a recipe according to the plasma processing performed in the plasma processing apparatus 10.

First Exemplary Embodiment

FIG. 6 is a diagram illustrating a configuration of a cooling system CS according to the first exemplary embodiment. The cooling system CS includes the chiller unit CH, the supply line SL, the drain line DLd (first drain line), a heat exchange unit HE.

The heat exchange unit HE is equipped with the evaporation chamber VP, the reservoir chamber RT and multiple pipes PP. Each pipe PP has a discharge hole JO. The heat exchange unit HE is provided within the placing table PD and configured to perform heat exchange through the coolant via the placing surface FA of the placing table PD.

The reservoir chamber RT stores therein the coolant which is supplied from the chiller unit CH via the supply line SL. The reservoir chamber RT is connected to the chiller unit CH via the supply line SL and is allowed to communicate with the evaporation chamber VP via the multiple pipes PP.

The evaporation chamber VP evaporates the coolant stored in the reservoir chamber RT. The evaporation chamber VP is connected to the chiller unit CH via the drain line DLd, extended along the placing surface FA of the placing table PD and includes the multiple discharge holes JO. The discharge holes JO are respectively provided at one ends of the pipes PP and arranged such that the coolant is discharged toward, among inner walls of the evaporation chamber VP, the heat transfer wall SF at the placing surface FA side from the pipes PP.

Figure 7:
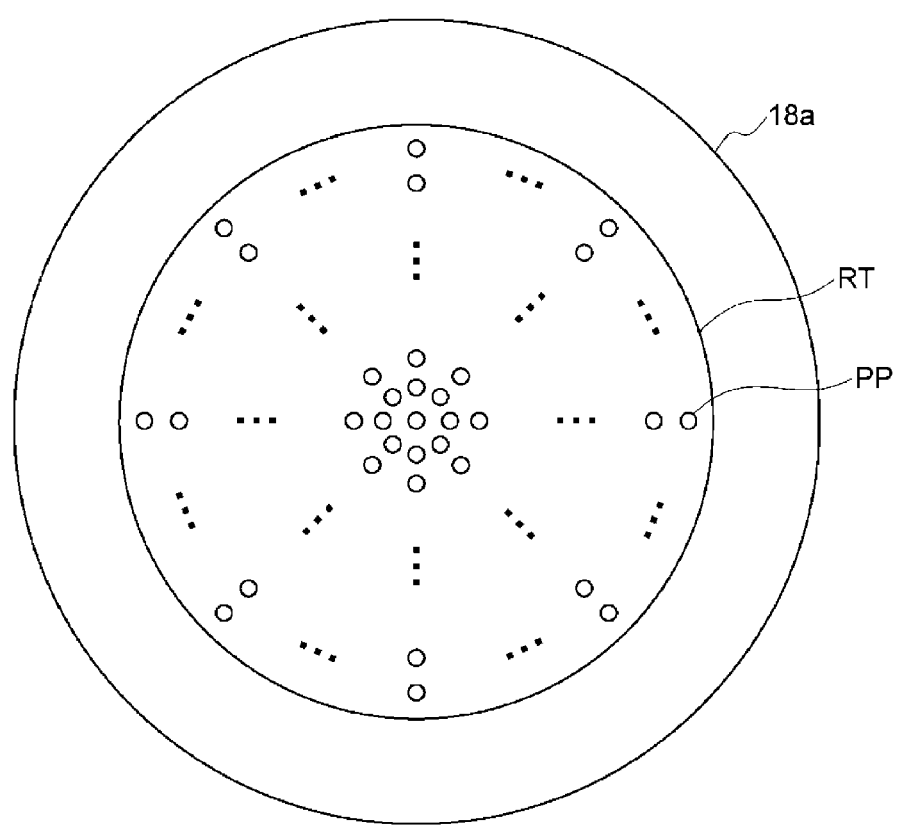
FIG. 7 is a diagram showing an example of a cross section of a lower electrode taken along a line X1-X1 of FIG. 6.

FIG. 7 is a diagram illustrating an example of a cross section of the lower electrode LE along a line X1-X1 of FIG. 6. On the cross section shown in FIG. 7, the multiple pipes PP (that is, the multiple discharge holes JO) are substantially equi-spaced in a circumferential direction and a diametrical direction of a circular cross section of the first plate 18$a$ when viewed from above the placing surface FA. As illustrated in FIG. 7, when viewed from above the placing surface FA, the multiple pipes PP (that is, the multiple discharge holes JO) are provided to be dispersed within the placing surface FA.

Reference is made back to FIG. 6. The chiller unit CH is connected to the heat exchange unit HE via the supply line SL of the coolant and the drain line DLd of the coolant. The chiller unit CH supplies the coolant to the heat exchange unit HE through the supply line SL and drains the coolant from the heat exchange unit HE through the drain line DLd.

The chiller unit CH includes a pressure gauge PRLd, a check valve CVLd, an expansion valve EVLd, a regulation valve AV, a compressor CM, a condenser CD, an expansion valve EVC and a pressure gauge PRC. The evaporation chamber VP is provided in the second plate 18$b$, and the reservoir chamber RT is provided in the first plate 18$a$.

More specifically, the supply line SL connects the condenser CD and the reservoir chamber RT, and the drain line DLd connects the condenser CD and the evaporation chamber VP.

In the chiller unit CH, the expansion valve EVC and the pressure gauge PRC are provided at the supply line SL in series in this sequence from the condenser CD side. In the chiller unit CH, the compressor CM, the regulation valve AV, the expansion valve EVLd, the check valve CVLd, and the pressure gauge PRLd are provided at the drain line DLd in series in this sequence from the condenser CD side.

An outlet of the condenser CD is connected to an inlet of the expansion valve EVC, and an outlet of the expansion valve EVC is connected to an inlet of the pressure gauge PRC. An outlet of the pressure gauge PRC is connected to the reservoir chamber RT.

An inlet of the condenser CD is connected to an outlet of the compressor CM, and an inlet of the compressor CM is connected to an outlet of the regulation valve AV. An inlet of the regulation valve AV is connected to an outlet of the expansion valve EVLd, and an inlet of the expansion valve EVLd is connected to an outlet of the check valve CVLd.

An inlet of the check valve CVLd is connected to an outlet of the pressure gauge PRLd, and an inlet of the pressure gauge PRLd is connected to the drain line DLd. The drain line DLd is connected to a liquid accumulation region VPL extended downwards below the discharge holes JO in the evaporation chamber VP. The liquid accumulation region VPL is a region within the evaporation chamber VP ranging from a surface of a bottom wall SFa exposed within the evaporation chamber VP to the discharge holes JO, and is a space in which, in the coolant discharged from the discharge holes JO, the coolant in the liquid phase (coolant as the liquid) can be accumulated (this definition is valid throughout the specification). Further, within the evaporation chamber VP, a region except the liquid accumulation region VPL includes a gas diffusion region VPA. The gas diffusion region VPA is extended upwards from the discharge holes JO in the evaporation chamber VP, and is a space in which, in the coolant discharged from the discharge holes JO, the coolant in the gas phase (coolant as the gas) can be diffused (this definition is valid throughout the specification).

The openness degree (%) of each of the expansion valve EVC, the regulation valve AV, the expansion valve EVLd, the check valve CVLd is controlled by the control unit Cnt.

Figure 8:
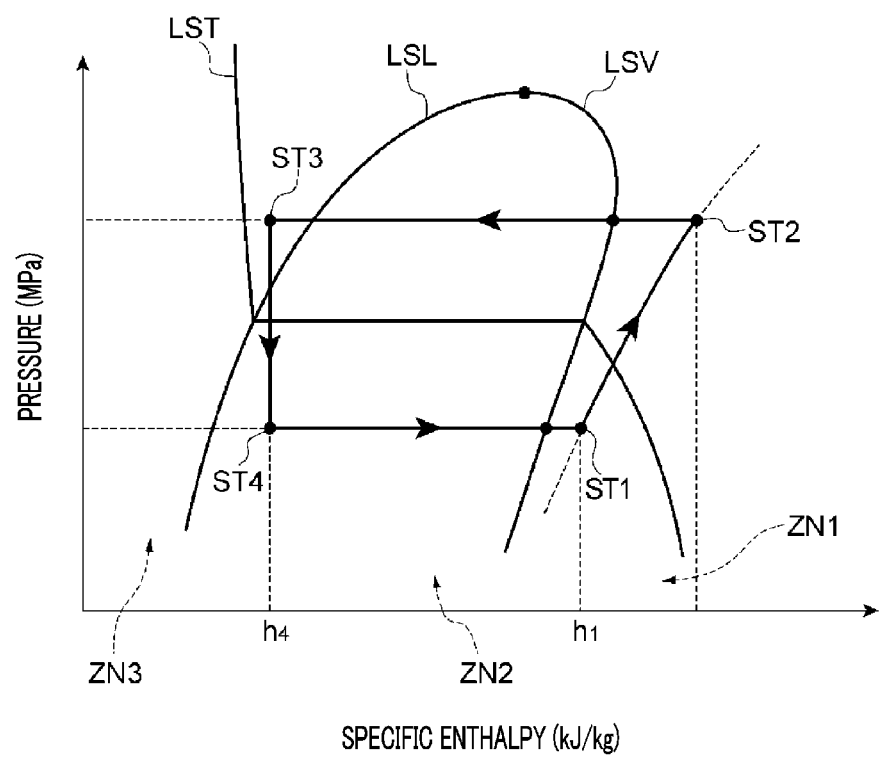
FIG. 8 provides a Ph chart (Mollier chart) showing a refrigeration cycle of the cooling system according to the present exemplary embodiment.
Figure 9:
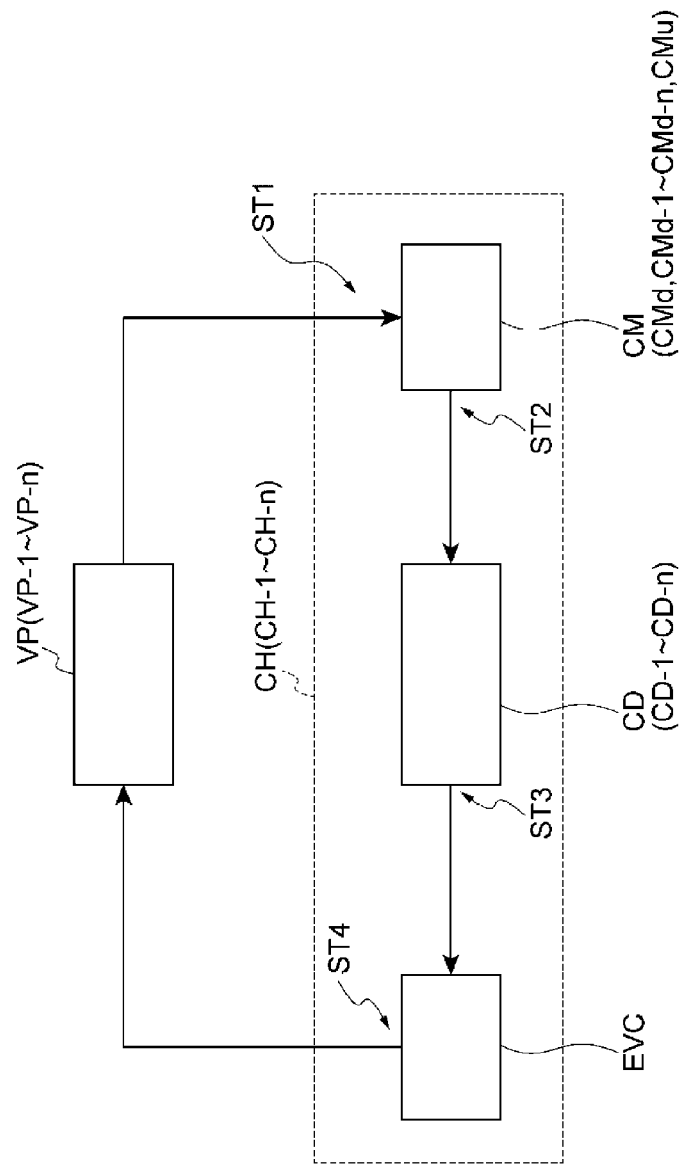
FIG. 9 is a diagram for describing, along with FIG. 8, the refrigeration cycle of the cooling system according to the present exemplary embodiment.

Referring to FIG. 8 and FIG. 9, a refrigeration cycle of the cooling system CS will be explained. FIG. 8 is a Ph chart (Mollier chart) showing the refrigeration cycle of the cooling system CS. FIG. 9 is a diagram for describing the refrigeration cycle of the cooling system CS along with FIG. 8.

First, the coolant drained from the evaporation chamber VP (or the branch chambers VP-1 to VP-n shown in FIG. 10, FIG. 15 and FIG. 17) of the heat exchange unit HE comes into a state ST1 when it reaches the inlet of the compressor CM (or a compressor CMd shown in FIG. 14, compressors CMd-1 to CMd-n shown in FIG. 10, FIG. 15 and FIG. 17 or a compressor CMu shown in FIG. 15). The state ST1 is within a superheated vapor zone ZN1. The coolant is compressed along the constant specific entropy line by the compressor CM and comes into a state ST2 when it reaches the outlet of the compressor CM. The state ST2 is within the superheated vapor zone ZN1.

A state of the coolant discharged from the compressor CM crosses a saturated vapor line LSV and a saturated liquid line LSL while being condensed by the condenser CD (or condensers CD-1 to CD-n shown in FIG. 17) along an isobar, and comes into a state ST3 when it reaches the outlet of the condenser CD. The state ST3 is within a supercooling zone ZN3. A state of the coolant discharged from the condenser CD crosses the saturated liquid line LSL while being expanded by the expansion valve EVC along a constant specific enthalpy line and comes into a state ST4 when it reaches the outlet of the expansion valve EVC. The state ST4 is within a wet vapor zone ZN2.

On the Ph chart shown in FIG. 8, an isotherm is drawn at a typical interval of 10° C. over the supercooling zone ZN3, the wet vapor zone ZN2 and the superheated vapor zone ZN1. The isotherm LST shown in FIG. 8 is extended as a nearly vertical curve coming downwards to the right with a rise of the specific enthalpy in the supercooling zone ZN3; bent at a point of intersection with the saturated liquid line LSL and extended as a horizontal straight line (line with a constant pressure) in the wet vapor zone ZN2; and bent again at a point of intersection with the saturated vapor line LSV and extended as a curve coming downwards to the right in the superheated vapor zone ZN1. The isotherm LST shown in FIG. 8 is an example of such an isotherm. The coolant in the wet vapor zone ZN2 is in a state in the middle of the vaporization process or the condensation process, and includes therein a saturated liquid and a saturated vapor. In a theoretical refrigeration cycle, the pressure and the temperature are maintained constant in the evaporation process or the condensation process.

The coolant in a low-pressure and low-temperature wet vapor state (state ST4) discharged from the expansion valve EVC crosses the saturated vapor line LSV while being evaporated along the isobar by depriving heat from the heat transfer wall SF in the evaporation chamber VP and reaches the outlet of the evaporation chamber VP. In the saturated state of the theoretical refrigeration cycle, if the pressure of the coolant is designated, a saturation temperature is decided, and if the temperature of the coolant is designated, a saturation pressure is decided. That is, an evaporating temperature of the coolant can be controlled by adjusting the pressure of the coolant.

In the vaporization chamber VP, the specific enthalpy of the coolant increases from h4 up to h1 during an isothermal change (from ST4 to ST1). A heat amount Wr (kJ/kg) deprived by 1 kg of the coolant from a cooling target object (heat transfer wall), which is provided nearby, is called a refrigeration effect. This heat amount is equal to a heat amount received by 1 kg of the coolant from the cooling target object and becomes equal to an increment (h1−h4) (kJ/kg) of the specific enthalpy of the coolant from the inlet of the evaporation chamber VP to the outlet thereof. Thus, there is established a relationship of Wr=h1−h4.

A refrigeration capacity Φ0 (kJ/s) (or (kW)) is calculated as a product of the heat amount Wr (kJ/kg) as the refrigeration effect and a coolant circulation amount Qmr (kg/s), as shown in following expression.

$$\Phi 3 = Qmr \times Wr = Qmr \times (h1-h4)$$

Here, Wr, h1 and h4 are defined as follows:
Wr: refrigeration effect (kJ/kg)
h1: specific enthalpy (kJ/kg) of the coolant (superheated vapor) at the outlet of the evaporation chamber VP
h4: specific enthalpy (kJ/kg) of the coolant (wet vapor) at the inlet of the evaporation chamber VP.

Further, a capacity whereby a cooling target object can be cooled by the cooling system CS is referred to as the "refrigeration capacity." Thus, the refrigeration capacity is proportional to the refrigeration effect of the coolant and the coolant circulation amount. Further, even if the evaporation chamber VP is divided into the branch chambers VP-1 to VP-n, the cooling capacities of the individual branch chambers VP-1 to VP-n can be controlled by adjusting the coolant circulation amount.

The cooling system CS performs the heat exchange in the evaporation chamber VP by the circulation of the coolant in the above-described refrigeration cycle shown in FIG. 8 and FIG. 9. The refrigeration cycle shown in FIG. 8 and FIG. 9 are realized in the following second to fifth exemplary embodiments in the same manner as in the first exemplary embodiment.

Second Exemplary Embodiment

FIG. 10 is a diagram illustrating a configuration of a cooling system CS according to a second exemplary embodiment. In the cooling system CS according to the second exemplary embodiment, the evaporation chamber VP and the reservoir chamber RT of the first exemplary embodiment are changed.

An evaporation chamber VP of the cooling system CS according to the second exemplary embodiment includes a plurality of first branch chambers (branch chambers VP-1 to VP-n). The branch chambers VP-1 to VP-n are spaced apart from each other within the second plate 18b of the placing table PD. The first branch chambers (branch chambers VP-1 to VP-n) respectively include discharge holes JO, and are provided to be dispersed within the placing surface FA when viewed from above the placing surface FA.

A reservoir chamber RT of the cooling system CS according to the second exemplary embodiment includes a plurality of second branch chambers (branch chambers RT-1 to RT-n). The branch chambers RT-1 to RT-n are spaced apart from each other within the first plate 18a of the placing table PD. The second branch chambers (branch chambers RT-1 to RT-n) communicate with the first branch chambers via pipes PP, respectively.

A drain line DLd is equipped with a plurality of first branch lines (branch lines DLd-1 to DLd-n). The branch lines DLd-1 to DLd-n are respectively connected to the branch chambers VP-1 to VP-n of the evaporation chamber VP, respectively.

A supply line SL is equipped with a plurality of second branch lines (branch lines SL-1 to SL-n). One end of the supply line SL is connected to a condenser CD of a chiller unit CH according to the second exemplary embodiment. The other end of the supply line SL is provided with the branch lines SL-1 to SL-n. That is, the supply line SL extended from the chiller unit CH of the second exemplary embodiment is branched into the branch lines SL-1 to SL-n. The branch lines SL-1 to SL-n are respectively connected to the branch chambers RT-1 to RT-n of the reservoir chamber RT.

The chiller unit CH according to the second exemplary embodiment is equipped with a pressure gauge PRC and an expansion valve EVC. The pressure gauge PRC and the expansion valve EVC are provided at the supply line SL. At the supply line SL, the expansion valve EVC is positioned between the condenser CD and the pressure gauge PRC.

The chiller unit CH according to the second exemplary embodiment is equipped with a plurality of pressure gauges PRLd (pressure gauges PRLd-1 to PRLd-n), a plurality of check valves CVLd (check valves CVLd-1 to CVLd-n), a plurality of expansion valves EVLd (expansion valves EVLd-1 to EVLd-n), a plurality of regulation valves AV (regulation valves AVd-1 to AVd-n), and a plurality of compressors CM (compressors CMd-1 to CMd-n).

The compressors CMd-1 to CMd-n are respectively provided at the branch lines DLd-1 to DLd-n. The regulation valves AVd-1 to AVd-n are respectively provided at the branch lines DLd-1 to DLd-n.

The expansion valves EVLd-1 to EVLd-n are respectively provided at the branch lines DLd-1 to DLd-n. The check valves CVLd-1 to CVLd-n are respectively provided at the branch lines DLd-1 to DLd-n. The pressure gauges PRLd-1 to PRLd-n are respectively provided at the branch lines DLd-1 to DLd-n.

The condenser CD according to the second exemplary embodiment is connected to each of the compressors CMd-1 to CMd-n. The compressors CMd-1 to CMd-n are respectively connected to the regulation valves AVd-1 to AVd-n. The regulation valves AVd-1 to AVd-n are respectively connected to the expansion valves EVLd-1 to EVLd-n.

The expansion valves EVLd-1 to EVLd-n are respectively connected to the check valves CVLd-1 to CVLd-n. The check valves CVLd-1 to CVLd-n are respectively connected to the pressure gauges PRLd-1 to PRLd-n. The pressure gauges PRLd-1 to PRLd-n are respectively connected to the branch chambers VP-1 to VP-n.

At the supply line SL, the pressure gauge PRC of the chiller unit CH according to the second exemplary embodiment is connected to a flow rate control valve FCV. The flow rate control valve FCV is connected to the chiller unit CH according to the second exemplary embodiment and the branch lines SL-1 to SL-n.

At the supply line SL, the flow rate control valve FCV is provided between the chiller unit CH and the branch lines SL-1 to SL-n.

The branch lines SL-1 to SL-n are respectively provided with flow rate control valves FCV-1 to FCV-n and pressure gauges PRC-1 to PRC-n. For example, the flow rate control valve FCV-1 and the pressure gauge PRC-1 are provided at the branch line SL-1, and the flow rate control valve FCV-n and the pressure gauge PRC-n are provided on the branch line SL-n.

Each of the flow rate control valves FCV-1 to FCV-n is connected to the flow rate control valve FCV. The pressure gauges PRC-1 to PRC-n are respectively connected to the flow rate control valves FCV-1 to FCV-n. The branch chambers RT-1 to RT-n are respectively connected to the pressure gauges PRC-1 to PRC-n.

The flow rate control valves FCV-1 to FCV-n are provided between the flow rate control valve FCV and the pressure gauges PRC-1 to PRC-n, respectively. The pressure gauges PRC-1 to PRC-n are provided between the flow rate control valves FCV-1 to FCV-n and the branch chambers RT-1 to RT-n, respectively.

In the second exemplary embodiment, a flow rate of the coolant supplied to the evaporation chamber VP (each of the branch chambers VP-1 to VP-n) through the supply line SL from the chiller unit CH is entirely first adjusted as the openness degree (%) of the flow rate control valve FCV is controlled. Then, by adjusting the openness degree (%) of each of the flow rate control valves FCV-1 to FCV-n, flow rates of the coolant in the respective branch lines SL-1 to SL-n (that is, flow rates of the coolant respectively supplied into the branch chambers RT-1 to RT-n) can be adjusted individually.

The openness degree (%) of each of the flow rate control valve FCV, the flow rate control valves FCV-1 to FCV-n, the regulation valves AVd-1 to AVd-n, the expansion valves EVLd-1 to EVLd-n, and the check valves CVLd-1 to CVLd-n is controlled by the control unit Cnt.

Figure 11:
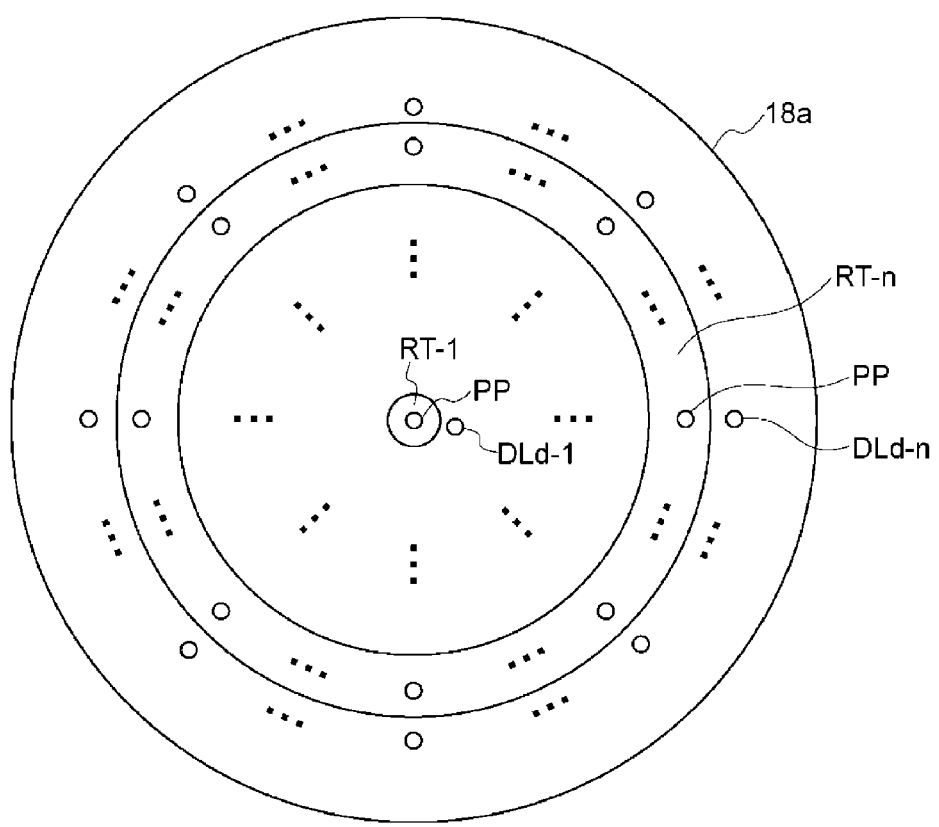
FIG. 11 is a diagram illustrating an example of a cross section of a lower electrode taken along a line X2-X2 of FIG. 10.
Figure 12:
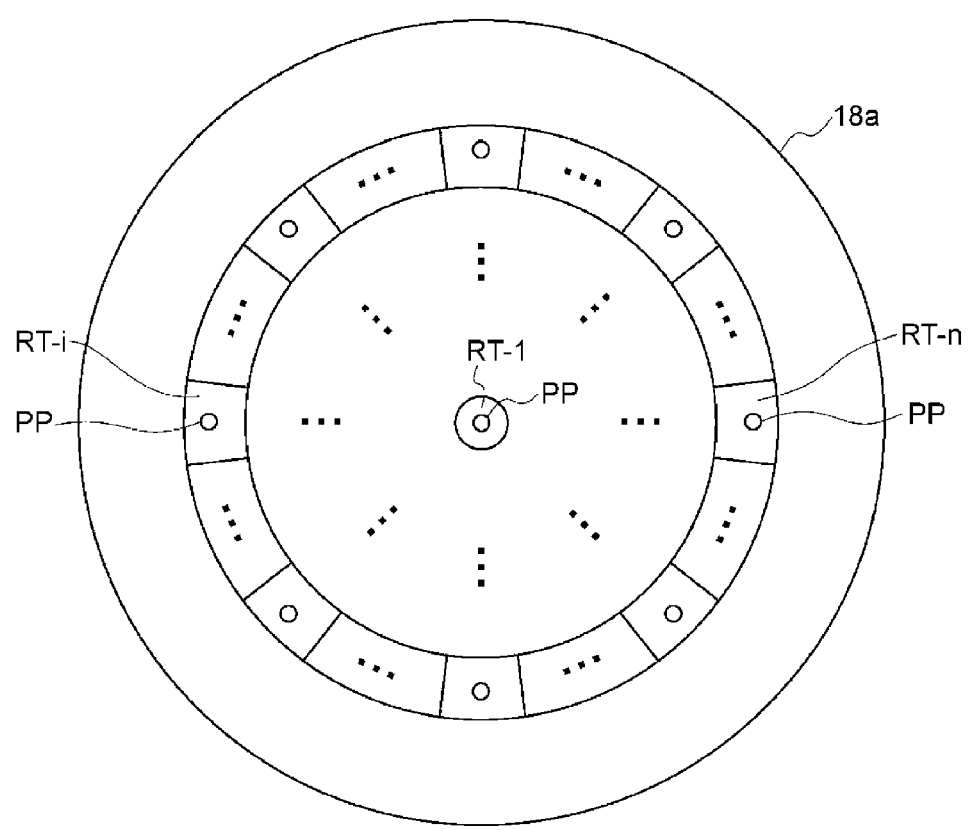
FIG. 12 is a diagram illustrating another example of the cross section of the lower electrode taken along the line X2-X2 of FIG. 10.

FIG. 11 is a diagram illustrating an example of a cross section of the lower electrode LE taken along a line X2-X2 of FIG. 10. FIG. 12 is a diagram illustrating another example of the cross section of the lower electrode LE taken along the line X2-X2 of FIG. 10.

As depicted in FIG. 11, the branch chambers RT-1 to RT-n are spaced apart from each other. On the cross section shown in FIG. 11, the branch chambers RT-1 to RT-n are arranged in sequence outwards in a diametrical direction from a center of a circular cross section of the first plate 18a, when viewed from above the placing surface FA. On the cross section shown in FIG. 11, the branch chamber RT-1 has a circular cross section and the branch chambers arranged at an outer side than the branch chamber RT-1 (for example, the branch chamber RT-n) have a strip-shaped cross section, when viewed from above the placing surface FA.

As depicted in FIG. 11, when viewed from above the placing surface FA, the multiple pipes PP (that is, the multiple discharge holes JO) are arranged while being dispersed within the placing surface FA. As can be seen from FIG. 11, the drain line DLd (the branch lines DLd-1 to DLd-n) connected to the branch chamber (branch chambers VP-1 to VP-n) communicating with a corresponding pipe PP is placed in the vicinity of the pipe PP.

Further, the branch chamber arranged at the outer side than the branch chamber RT-1 (for example, branch chamber RT-i, branch chamber RT-n; i denotes an integer within a range of $1 < i < n$) may not be limited to having the strip-shaped cross section shown in FIG. 11. By way of example, this branch chamber may have a cross section in which the corresponding strip-shaped cross section is divided in plural along the circumference thereof and the divided cross-sections are spaced apart from each other, as shown in FIG. 12.

FIG. 13 is a diagram for describing an example operation of the cooling system CS shown in FIG. 10. Operations (operations PT1 to PT3) shown in FIG. 13 may also be applicable to cooling systems CS shown in FIG. 15 and FIG. 17 (the fourth exemplary embodiment and the fifth exemplary embodiment) to be described later.

The operations shown in FIG. 13 can be controlled by the control unit Cnt. The operations shown in FIG. 13 are operations of the flow rate control valves FCV-1 to FCV-n, and are operations for changing the openness degree (%) of each of the flow rate control valves FCV-1 to FCV-n with a lapse of time such as a period T1, a period T2, and so forth. For example, the period T2 is a time period following the period T1. In each period such as the period T1, a sum of the openness degree (%) of the respective flow rate control valves FCV-1 to FCV-n is 100%.

The operation PT1 is an operation for changing the openness degree (%) of each of the flow rate control valves FCV-1 to FCV-n with a lapse of time such as the period T1, the period T2, and so forth. By way of example, in the operation PT1, from a state in which the openness degree (%) of the flow rate control valve FCV-1 is set to be 30% and the openness degree (%) of the flow rate control valve FCV-n is set to be 10% in the period T1, the openness degree (%) of the flow rate control valve FCV-1 is changed to 20% and the openness degree (%) of the flow rate control valve FCV-n is changed to 5% in the period T2 following the period T1.

The operation PT2 is an operation of fixing the openness degree (%) of each of the flow rate control valves FCV-1 to FCV-n in all periods (the period T1 and so forth). By way of example, in the operation PT2, the openness degree (%) of the flow rate control valve FCV-1 is fixed to 50%, and the openness degree (%) of the flow rate control valve FCV-n is fixed to 20% in all periods (the period T1 and so forth). In this way, by fixing the openness degree of each flow rate control valve and adjusting the coolant circulation amount, the refrigeration capacity of each branch chamber can be controlled as required even when a heat input is not uniform in the plasma processing. The operation PT2 is a specific example of the operation PT1.

The operation PT3 is an operation for setting the openness degree (%) of only one of the flow rate control valves FCV-1 to FCV-n to 100% in each period such as the period T1, the period T2, and so forth. By way of example, in the operation PT3, the openness degree (%) of the flow rate control valve FCV-1 is set to be 100% in the period T1, and the openness degree (%) of the flow rate control valve FCV-n is set to be 100% in the period T2 following the period T1. In this way, by adjusting a coolant supply time with respect to the branch chamber to be subjected to the temperature control, the refrigeration capacity of each branch chamber can be controlled as required even when the heat input is not uniform in the plasma processing. The operation PT3 is a specific example of the operation PT1.

Third Exemplary Embodiment

FIG. 14 is a diagram illustrating a configuration of a cooling system CS according to a third exemplary embodiment. The cooling system CS according to the third exemplary embodiment has a drain line DLu (second drain line) in addition to the configuration of the first exemplary embodiment.

The drain line DLu is configured to connect an evaporation chamber VP and a chiller unit CH. To be more specific, the drain line DLu connects the evaporation chamber VP and a condenser CD of the chiller unit CH and is connected to a gas diffusion region VPA of the evaporation chamber VP which is upwardly extended above discharge holes JO.

The chiller unit CH according to the third exemplary embodiment is further equipped with a pressure gauge PRLu, a check valve CVLu, an expansion valve EVLu, a regulation valve AVu and a compressor CMu. The compressor CMu, the regulation valve AVu, the expansion valve EVLu, the check valve CVLu and the pressure gauge PRLu are provided at the drain line DLu.

The condenser CD according to the third exemplary embodiment is connected to the compressor CMu. The compressor CMu is connected to the regulation valve AVu. The regulation valve AVu is connected to the expansion valve EVLu. The expansion valve EVLu is connected to the check valve CVLu. The check valve CVLu is connected to the pressure gauge PRLu. The pressure gauge PRLu is connected to the evaporation chamber VP.

The pressure gauge PRLu, the check valve CVLu, the expansion valve EVLu, the regulation valve AVu and the compressor CMu have the same functions as those of the pressure gauge PRLd, the check valve CVLd, the expansion valve EVLd, the regulation valve AVd and the compressor CMd, respectively.

An openness degree (%) of each of the regulation valve AVu, the expansion valve EVLu and the check valve CVLu is controlled by the control unit Cnt.

Fourth Exemplary Embodiment

FIG. 15 is a diagram illustrating a configuration of a cooling system CS according to a fourth exemplary embodiment. The cooling system CS according to the fourth exemplary embodiment has a drain line DLu in addition to the configuration of the second exemplary embodiment. The drain line DLu according to the fourth exemplary embodiment is equipped with branch lines DLu-1 to DLu-n.

The branch lines DLu-1 to DLu-n are respectively connected to branch chambers VP-1 to VP-n. The branch lines DLu-1 to DLu-n are respectively provided with check valves CVLu-1 to CVLu-n.

The check valves CVLu-1 to CVLu-n may be provided within the first plate 18a or at an outside of the lower electrode LE. An openness degree (%) of each of the check valves CVLu-1 to CVLu-n is controlled by the control unit Cnt.

The branch chambers VP-1 to VP-n are connected to a reservoir chamber RK provided in the first plate 18a via the branch lines DLu-1 to DLu-n, respectively, and the reservoir chamber RK is connected to a chiller unit CH via the drain line DLu. The drain line DLu (including the branch lines DLu-1 to DLu-n) connects, via the reservoir chamber RK, each of the branch chambers VP-1 to VP-n to the chiller unit CH according to the fourth exemplary embodiment.

The coolant discharged from the branch chambers VP-1 to VP-n is stored in the reservoir chamber RK via the branch lines DLu-1 to DLu-n, respectively, and the coolant stored in the reservoir chamber RK is sent from the reservoir chamber RK into the chiller unit CH via the drain line DLu connected to the reservoir chamber RK.

The chiller unit CH according to the fourth exemplary embodiment is further equipped with, the same as in the third exemplary embodiment, a pressure gauge PRLu, a check valve CVLu, an expansion valve EVLu, a regulation valve AVu and a compressor CMu connected to the drain line DLu. The pressure gauge PRLu, the check valve CVLu, the expansion valve EVLu, the regulation valve AVu and the compressor CMu according to the fourth exemplary embodiment are the same as those of the third exemplary embodiment.

Figure 16:
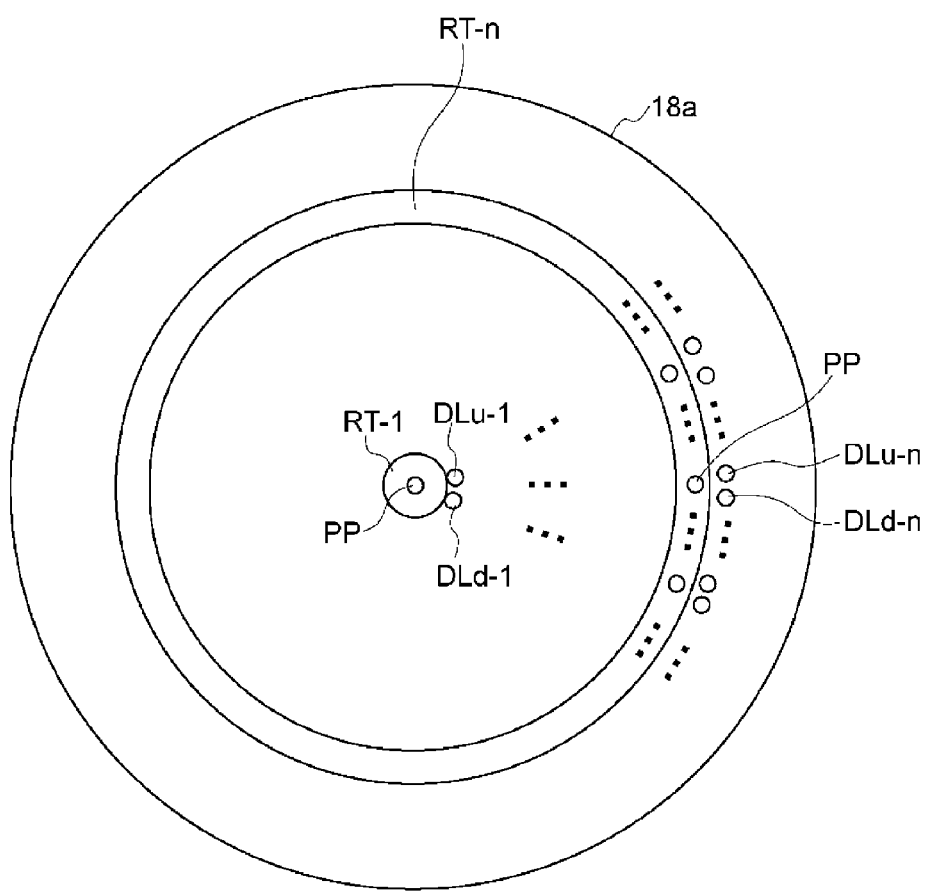
FIG. 16 is a diagram illustrating an example of a cross section of a lower electrode taken along a line X3-X3 of FIG. 15.

FIG. 16 is a diagram illustrating an example of a cross section of the lower electrode LE taken along a line X3-X3 of FIG. 15. As shown in FIG. 16, in the fourth exemplary embodiment, a shape and an arrangement of the branch chambers RT-1 to RT-n, an arrangement of the pipes PP, and an arrangement of the branch lines DLd-1 to DLd-n are the same as those of the second exemplary embodiment shown in FIG. 11.

As depicted in FIG. 16, in the fourth exemplary embodiment, the drain line DLu (the branch lines DLu-1 to DLu-n) connected to the branch chamber (branch chambers VP-1 to VP-n) communicating with a corresponding pipe PP is placed in the vicinity of the corresponding pipe PP.

Fifth Exemplary Embodiment

FIG. 17 is a diagram illustrating a configuration of a cooling system CS according to a fifth exemplary embodiment. The cooling system CS according to the fifth exemplary embodiment has a plurality of chiller units (chiller units CH-1 to CH-n). Each of the chiller units CH-1 to CH-n has the same function as that of the chiller unit CH according to the second exemplary embodiment. Particularly, each of the chiller units CH-1 to CH-n (for example, the chiller unit CH-1) supplies the coolant into and drains the coolant from a single set of a second branch chamber and a first branch chamber communicating with each other (for example, a branch chamber RT-1 and a branch chamber VP-1 connected to the chiller unit CH-1).

The chiller units CH-1 to CH-n are respectively provided with condensers CD-1 to CD-n. Each of the condensers CD-1 to CD-n according to the fifth exemplary embodiment has the same function as that of the condenser CD according to the first exemplary embodiment to the fourth exemplary embodiment.

Branch lines SL-1 to SL-n are respectively connected to branch chambers RT-1 to RT-n and respectively connected to the condensers CD-1 to CD-n. For example, the branch line SL-1 connects the branch chamber RT-1 to the condenser CD-1 of the chiller unit CH-1.

Branch lines DLd-1 to DLd-n are respectively connected to branch chambers VP-1 to VP-n and respectively connected to the condensers CD-1 to CD-n. For example, the branch line DLd-1 connects the branch chamber VP-1 and the condenser CD-1 of the chiller unit CH-1.

Each of the chiller units CH-1 to CH-n is provided with an expansion valve EVC and a pressure gauge PRC.

The chiller units CH-1 to CH-n are respectively equipped with compressors CMd-1 to CMd-n and regulation valves AVd-1 to AVd-n.

The chiller units CH-1 to CH-n are equipped with expansion valves EVLd-1 to EVLd-n, check valves CVLd-1 to CVLd-n, and pressure gauges PRLd-1 to PRLd-n, respectively.

The condensers CD-1 to CD-n are respectively connected to the expansion valves EVC and the compressors CMd-1 to CMd-n.

The same as in the second exemplary embodiment, the cooling system CS according to the fifth exemplary embodiment is equipped with flow rate control valves FCV-1 to FCV-n and pressure gauges PRC-1 to PRC-n. The flow rate control valves FCV-1 to FCV-n are respectively provided at the branch lines SL-1 to SL-n. The pressure gauges PRC-1 to PRC-n are respectively provided at the branch lines SL-1 to SL-n. The flow rate control valves FCV-1 to FCV-n are provided between the chiller units CH-1 to CH-n and the pressure gauges PRC-1 to PRC-n, respectively. The pressure gauges PRC-1 to PRC-n are provided between the flow rate control valves FCV-1 to FCV-n and the branch chambers RT-1 to RT-n, respectively. By adjusting openness degree (%) of the respective flow rate control valves FCV-1 to FCV-n, flow rates of the coolant supplied into the branch chambers RT-1 to RT-n from the chiller units CH-1 to CH-n, respectively, can be adjusted.

Figure 18:
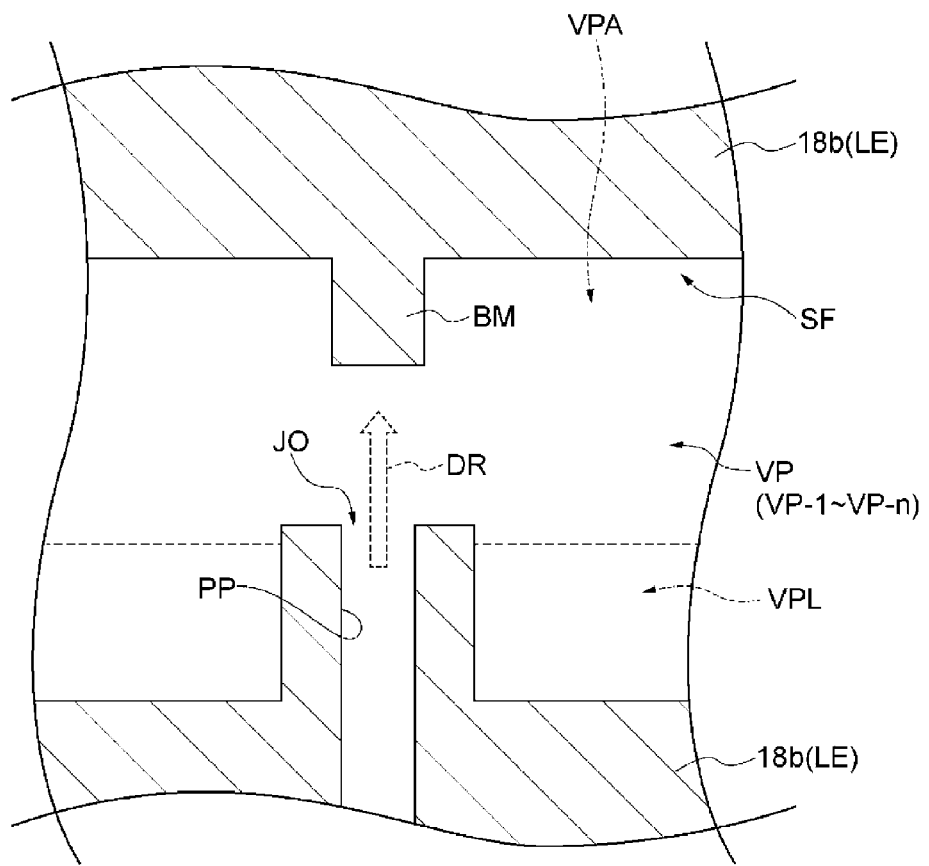
FIG. 18 is a diagram illustrating a major configuration of an evaporation chamber included in each of the cooling systems of FIG. 6, FIG. 10, FIG. 14, FIG. 15 and FIG. 17.

FIG. 18 is a diagram illustrating a major configuration of the evaporation chamber VP (and the branch chambers VP-1 to VP-n) provided in the cooling system CS shown in each of FIG. 6, FIG. 10, FIG. 14, FIG. 15 and FIG. 17. Multiple protrusions BM are provided at the heat transfer wall SF of the evaporation chamber VP. A protrusion BM is provided at the heat transfer wall SF of each of the branch chambers VP-1 to VP-n. Each protrusion BM is provided as one body with the heat transfer wall SF and has relatively high thermal conductivity, the same as the heat transfer wall SF.

The discharge hole JO of the pipe PP is provided to face the protrusion BM. The coolant is discharged from the discharge hole JO in a discharging direction DR to reach the protrusion BM. The coolant discharged to the protrusion BM can receive heat from the protrusion BM and the heat transfer wall SF. The heat of the protrusion BM and the heat transfer wall SF is transferred to the coolant discharged to the protrusion BM, so that the heat can be released from the placing surface FA by the coolant.

Further, in addition to the aforementioned configuration where the protrusion BM is provided at the heat transfer wall SF, in order to achieve the same effect as that in the case of providing the protrusion BM, it may be possible to adopt a configuration in which a column-shaped pin (having a diameter ranging from 1.0 mm to 5.0 mm and a height ranging from 1.0 mm to 5.0 mm) is provided at the heat transfer wall SF; a configuration in which a dimple (having a diameter ranging from 1.0 mm to 5.0 mm and a depth ranging from 1.0 mm to 5.0 mm) is provided at the heat transfer wall SF; a configuration in which a surface roughness of the heat transfer wall SF is increased to have a Ra of 6.3 μm and a Rz of 25 μm; a configuration in which a surface processing is performed on the surface of the heat transfer wall SF to have a porous shape by thermal spraying or the like, and so forth.

In case that the column-shape pin is provided at the heat transfer wall SF and in case that the dimple is provided at the heat transfer wall SF, a portion to which the coolant is discharged is further narrowed (further miniaturized) as compared to the case that the protrusion BM is provided, spatial resolution is improved. In case of increasing the surface roughness of the heat transfer wall SF and in case of performing the surface processing on the surface of the heat transfer wall SF to have the porous shape thereto by thermal spraying or the like, particularly, a surface area of the portion to which the coolant is discharged is increased as compared to that of the protrusion BM, so that the thermal conductivity is increased.

According to the configurations of the cooling systems CS of the first exemplary embodiment to the fifth exemplary embodiment, since the multiple discharge holes JO from which the coolant is discharged to the heat transfer wall SF of the heat exchange unit HE are provided to be dispersed within the placing surface FA when viewed from above the placing surface FA, the coolant can be uniformly discharged toward the heat transfer wall SF regardless of place, when viewed from above the placing surface FA. Therefore, the in-surface non-uniformity in the heat release upon the wafer W placed on the placing surface FA can be reduced.

Since the drain line DLd (including the branch lines DLd-1 to DLd-n) is connected to the liquid accumulation region VPL extended under the discharge holes JO in the evaporation chamber VP (branch chambers VP-1 to VP-n), the coolant accumulated on the bottom wall SFa can be efficiently collected.

Furthermore, since the vaporized coolant has a reduced heat transfer coefficient and mostly does not contribute to the heat exchange, this evaporated coolant may be a factor hampering the heat exchange if it stays. Thus, it is desirable that the vaporized coolant is discharged promptly. For the purpose, since the drain line DLu is provided in the gas diffusion region VPA upwardly extended above the discharge holes JO in the evaporation chamber VP (branch chambers VP-1 to VP-n), the vapor of the coolant existing around the heat transfer wall SF can be collected rapidly.

Further, in case that the evaporation chamber VP and the reservoir chamber RT are respectively divided into the multiple branch chambers (the branch chambers VP-1 to VP-n) and the multiple branch chambers (the branch chambers RT-1 to RT-n) which are spaced apart from each other as in the second exemplary embodiment, the fourth exemplary embodiment and the fifth exemplary embodiment, since the multiple branch chambers are provided to be dispersed within the placing surface FA when viewed from above the placing surface FA, the in-surface non-uniformity in the heat release upon the wafer W placed on the placing surface FA can be reduced.

Moreover, in case that the reservoir chamber RT is divided into the multiple branch chambers RT-1 to RT-n which are spaced apart from each other as in the second exemplary embodiment, the fourth exemplary embodiment and the fifth exemplary embodiment, since the flow rates of the coolant supplied into the respective branch chambers can be adjusted individually, the heat release upon the wafer W is accurately controlled place by place. Accordingly, the in-surface non-uniformity in the heat release upon the wafer W can be further reduced.

Further, in case that the evaporation chamber VP and the reservoir chamber RT are respectively divided into the multiple branch chambers (the branch chambers VP-1 to VP-n) and the multiple branch chambers (the branch chambers RT-1 to RT-n) which are spaced apart from each other as in the second exemplary embodiment, the fourth exemplary embodiment and the fifth exemplary embodiment, since the chiller units CH-1 to CH-n are respectively provided for the branch chambers RT-1 to RT-n of the reservoir chamber RT, and the circulation of the coolant can be performed by the individual chiller units CH-1 to CH-n independently, the heat release upon the wafer W can be more accurately controlled place by place.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A cooling system, comprising:
a heat exchange unit provided within a placing table on which a processing target object is placed and configured to perform a heat exchange by a coolant;
a compressor configured to compress the coolant;
n number of (n is an integer equal to or larger than 2) gas-liquid separating units configured to separate a gas and a liquid included in the coolant;
a supply line connected to an inlet of the heat exchange unit;
a drain line provided between an outlet of the heat exchange unit and an inlet of the compressor;
a gas line provided between an outlet of the compressor and the drain line;
n number of liquid lines respectively provided between the supply line and the n number of gas-liquid separating units;
n number of cooling lines respectively provided at the n number of gas-liquid separating units; and
n number of primary expansion valves and n number of subsidiary expansion valves configured to expand the coolant,
wherein the n number of gas-liquid separating units include a first gas-liquid separating unit to a $n^{th}$ gas-liquid separating unit and are provided at the gas line,
the first gas-liquid separating unit to the $n^{th}$ gas-liquid separating unit are arranged in sequence from a side of a compressor and connected to the gas line in series,
the n number of liquid lines include a first liquid line to a $n^{th}$ liquid line,
the first liquid line to the $n^{th}$ liquid line are respectively connected to the first gas-liquid separating unit to the $n^{th}$ gas-liquid separating unit,
the n number of cooling lines include a first cooling line to a $n^{th}$ cooling line,
the first cooling line to the $n^{th}$ cooling line are respectively extended via the first gas-liquid separating unit to the $n^{th}$ gas-liquid separating unit,
the n number of primary expansion valves include a first primary expansion valve to a $n^{th}$ primary expansion valve,
the first primary expansion valve to the $n^{th}$ primary expansion valve are respectively provided at the first liquid line to the $n^{th}$ liquid line,
the n number of subsidiary expansion valves include a first subsidiary expansion valve to a $n^{th}$ subsidiary expansion valve,
the first subsidiary expansion valve to the $n^{th}$ subsidiary expansion valve are respectively provided at the first cooling line to the $n^{th}$ cooling line,
both ends of the first cooling line are connected to a cooling device, and
the second cooling line to the $n^{th}$ cooling line are provided between the drain line and the first liquid line to the $(n-1)^{th}$ liquid line via the second gas-liquid separating unit to the $n^{th}$ gas-liquid separating unit, respectively.

2. The cooling system of claim 1,
wherein the coolant includes a first coolant to a $n^{th}$ coolant, and
a boiling point of the first coolant to a boiling point of the $n^{th}$ coolant are lowered in this sequence.

3. The cooling system of claim 2, further comprising:
a control unit configured to control opening/closing of each of the n number of primary expansion valves and the n number of subsidiary expansion valves,
wherein the control unit controls the n number of subsidiary expansion valves to be closed when opening only the first primary expansion valve in the n number of primary expansion valves, and
the control unit controls, when opening only an $i^{th}$ primary expansion valve (i is an integer equal to or larger than 2 and equal to or smaller than n) in the n number of primary expansion valves, only the first subsidiary expansion valve to a $(i-1)^{th}$ subsidiary expansion valve in the n number of subsidiary expansion valves to be opened.

4. The cooling system of claim 3,
wherein a $(n+1)^{th}$ coolant flows in the first cooling line from the cooling device,
a temperature of the $(n+1)^{th}$ coolant flowing in the first cooling line is lower than the boiling point of the first coolant and higher than the boiling point of the second coolant within the first gas-liquid separating unit,
the control unit controls, when opening only a $j^{th}$ primary expansion valve (j is an integer equal to or larger than 2 and equal to or smaller than $(n-1)$, n is equal to or larger than 3), a temperature of a $(h-1)^{th}$ coolant flowing in a $h^{th}$ cooling line (h is an integer equal to or larger than 2 and equal to or smaller than j) to be lower than a boiling point of a $h^{th}$ coolant and higher than a boiling point of a $(h+1)^{th}$ coolant within a $h^{th}$ gas-liquid separating unit, and
the control unit controls, when opening only the $n^{th}$ primary expansion valve, a temperature of a $(n-1)^{th}$ coolant flowing in the $n^{th}$ cooling line to be lower than the boiling point of the $n^{th}$ coolant within the $n^{th}$ gas-liquid separating unit.

5. The cooling system of claim 1,
wherein the first gas-liquid separating unit to the $n^{th}$ gas-liquid separating unit are equipped with a first cooling device to a $n^{th}$ cooling device and a first separating device to a $n^{th}$ separating device, respectively,
a $k^{th}$ cooling device and a $k^{th}$ separating device provided in a $k^{th}$ gas-liquid separating unit (k is an integer equal to or larger than 1 and equal to or smaller than n) are provided at the gas line, arranged in sequence from the side of the compressor and connected to the gas line in series,
a $k^{th}$ cooling line is extended via the $k^{th}$ cooling device, and
a $k^{th}$ liquid line is connected to the $k^{th}$ separating device.

* * * * *

UNITED STATES PATENT AND TRADEMARK OFFICE
CERTIFICATE OF CORRECTION

PATENT NO.      : 10,907,864 B2
APPLICATION NO. : 16/367428
DATED           : February 2, 2021
INVENTOR(S)     : Takehiko Arita It is certified that error appears in the above-identified patent and that said Letters Patent is hereby corrected as shown below:

In the Specification

Column 10, Line 59, "Int" should be -- In2 --.

Column 10, Line 62, "Int" should be -- In2 --.

Column 11, Line 11, "Int" should be -- In2 --.

Column 11, Line 15, "Int" should be -- In2 --.

Column 11, Line 44, "CL1" should be -- CL_1 --.

Column 11, Line 46, "separating unit ALL The coolant" should be -- separating unit AL_1. The coolant --.

Column 13, Line 3, "Int" should be -- In2 --.

Column 13, Line 6, "Int" should be -- In2 --.

Column 13, Line 24, "Int" should be -- In2 --.

Column 13, Line 28, "Int" should be -- In2 --.

Column 14, Line 31, "Int" should be -- In2 --.

Column 14, Line 38, "Int" should be -- In2 --.

Column 14, Line 42, "Int" should be -- In2 --.

Column 21, Line 35, "Φ3=Qmr × Wr=Qmr × (h1-h4)" should be -- Φ0=Qmr × Wr=Qmr × (h1-h4) --.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*